(12) United States Patent
Yang et al.

(10) Patent No.: US 12,543,550 B2
(45) Date of Patent: Feb. 3, 2026

(54) INTERCONNECTS INCLUDING GRAPHENE CAPPING AND GRAPHENE BARRIER LAYERS

(71) Applicant: TAIWAN SEMICONDUCTOR MANUFACTURING CO., LTD., Hsinchu (TW)

(72) Inventors: Shin-Yi Yang, New Taipei Clty (TW); Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 701 days.

(21) Appl. No.: 17/884,301

(22) Filed: Aug. 9, 2022

(65) Prior Publication Data
US 2022/0384336 A1 Dec. 1, 2022

Related U.S. Application Data

(60) Division of application No. 16/714,431, filed on Dec. 13, 2019, now Pat. No. 11,462,470, which is a continuation of application No. 15/715,327, filed on Sep. 26, 2017, now Pat. No. 10,510,657.

(51) Int. Cl.
*H01L 23/522* (2006.01)
*H01L 21/768* (2006.01)
*H01L 23/528* (2006.01)
*H01L 23/532* (2006.01)

(52) U.S. Cl.
CPC ........ *H01L 23/5226* (2013.01); *H01L 21/768* (2013.01); *H01L 21/76802* (2013.01); *H01L 21/76832* (2013.01); *H01L 21/7684* (2013.01); *H01L 21/76849* (2013.01); *H01L 21/76852* (2013.01); *H01L 23/5283* (2013.01); *H01L 23/53223* (2013.01); *H01L 23/53238* (2013.01); *H01L 23/53252* (2013.01); *H01L 23/53266* (2013.01); *H01L 23/53276* (2013.01); *H01L 23/5329* (2013.01); *H01L 23/53209* (2013.01)

(58) Field of Classification Search
CPC ............ H01L 23/5226; H01L 23/5283; H01L 23/53223; H01L 23/53238; H01L 23/53252; H01L 23/53266; H01L 23/53276
See application file for complete search history.

(56) References Cited

U.S. PATENT DOCUMENTS

| | | |
|---|---|---|
| 5,512,514 A | 4/1996 | Lee |
| 5,635,423 A | 6/1997 | Huang et al. |
| 6,376,353 B1 | 4/2002 | Zhou |
| 8,895,433 B2 | 11/2014 | Bonilla |
| 2002/0086518 A1 | 7/2002 | Asami |
| 2003/0022413 A1 | 1/2003 | Nakashiba |
| 2003/0080428 A1 | 5/2003 | Izumitani et al. |

(Continued)

*Primary Examiner* — Marcos D. Pizarro
(74) *Attorney, Agent, or Firm* — Maschoff Brennan

(57) ABSTRACT

A semiconductor structure includes a semiconductor substrate, a dielectric layer, a via, a first graphene layer, and a metal line. The dielectric layer is over the semiconductor substrate. The via extends through the dielectric layer. The first graphene layer extends along a top surface of the via. The metal line spans the first graphene layer. The metal line has a line width decreasing as a distance from the first graphene layer increases.

20 Claims, 20 Drawing Sheets

(56) References Cited

U.S. PATENT DOCUMENTS

| | | | |
|---|---|---|---|
| 2003/0089928 A1* | 5/2003 | Saito | H01L 23/53238 |
| | | | 257/E21.585 |
| 2004/0155342 A1 | 8/2004 | Usami et al. | |
| 2005/0189655 A1 | 9/2005 | Furukawa | |
| 2006/0211235 A1 | 9/2006 | Usami | |
| 2008/0006944 A1 | 1/2008 | Yang | |
| 2008/0157380 A1 | 7/2008 | Hong | |
| 2011/0304026 A1 | 12/2011 | Tsui | |
| 2014/0127896 A1 | 5/2014 | Bonilla | |
| 2014/0291819 A1* | 10/2014 | Barth | H10K 85/221 |
| | | | 257/659 |
| 2014/0367857 A1* | 12/2014 | Yang | H01L 21/76849 |
| | | | 438/653 |
| 2016/0005648 A1 | 1/2016 | Yang et al. | |
| 2016/0108546 A1 | 4/2016 | Park et al. | |
| 2017/0011996 A1 | 1/2017 | Lee | |
| 2018/0350913 A1* | 12/2018 | Yang | H01L 23/5226 |

* cited by examiner

INTERCONNECTS INCLUDING GRAPHENE CAPPING AND GRAPHENE BARRIER LAYERS

PRIORITY CLAIM AND CROSS-REFERENCE

The present application is a Divisional Application of U.S. application Ser. No. 16/714,431, filed Dec. 13, 2019, which is a continuation application of U.S. application Ser. No. 15/715,327, filed Sep. 26, 2017, now U.S. Pat. No. 10,510,657, issued Dec. 17, 2019, which are herein incorporated by reference in their entirety.

BACKGROUND

In a semiconductor device, an interconnecting structure can be used to electrically connect devices in different layers or in the same layer in an integrated circuit. However, as semiconductor devices continue to be scaled down, an interval between adjacent devices is increasingly shrunk, and a process window of the interconnecting structure is significantly decreased. Accordingly, it is more and more difficult to manufacturing the interconnecting structure between the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
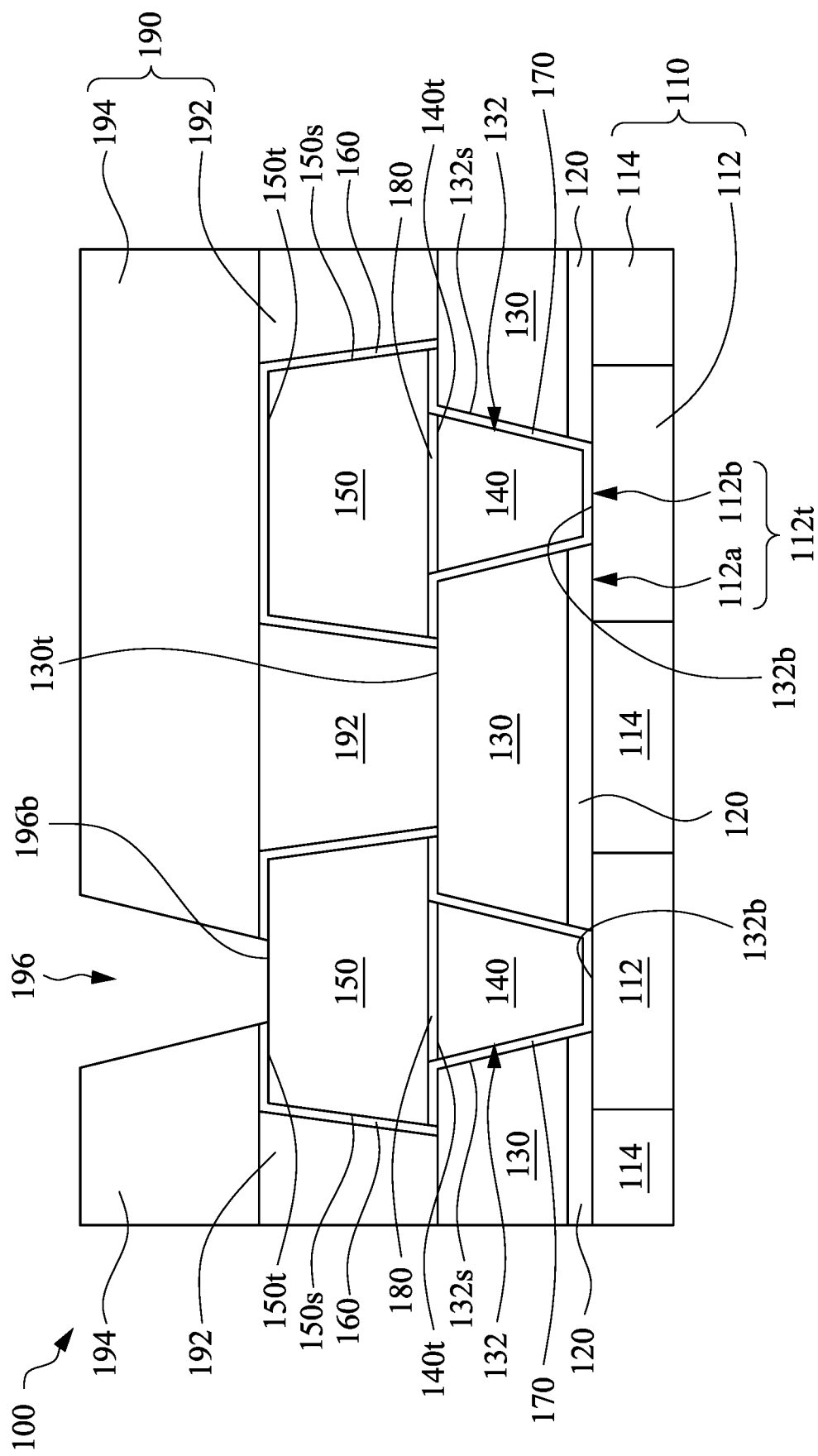
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing an interconnecting structure of a semiconductor device, during a patterning process of a line, a corner of a via under the line may be etched and damaged due to a photolithography overlapping shift. Furthermore, a liner layer is additionally formed to cover the line to improve the reliability, and a barrier layer is formed to cover the liner layer. However, the additional liner layer and barrier layer degrade the RC (resistance and capacitance) performance of the semiconductor device and increase the fabrication cost. Moreover, in a via hole patterning process of a dielectric layer over the line, an additional etching stop layer is needed for the etching stop of the via hole patterning process. However, the etching stop layer causes the capacitance impact and increases the fabrication cost.

Embodiments of the present disclosure are directed to providing a semiconductor device and a method for manufacturing the semiconductor device, in which a capping layer having an etch selectivity with respect to a line may be disposed on a top surface of a via, such that the capping layer may prevent the via from being damaged during a patterning process of the line. The via may be formed from a conductive material which has an etch selectivity with respect to the line, such that the via is not damaged during the patterning process of the line. Furthermore, another capping layer having an etch selectivity with respect to the line is formed to cap the line, such that a liner layer and a barrier layer are omitted, thereby enhancing the RC performance of the semiconductor device and reducing the fabrication cost. Moreover, since the capping layer covering the line has an etch selectivity with respect to the line, the capping layer is used as an etching stop layer, and the typical etching stop layer is omitted, thereby preventing the capacitance impact and reducing the fabrication cost.

FIG. 1 is schematic cross-sectional view of a semiconductor device in accordance with various embodiments. In some embodiments, a semiconductor device 100 includes a substrate 110, a dielectric layer 130, one or more vias 140, one or more lines 150, and one or more capping layers 160. In some exemplary examples, the substrate 110 includes at least one dielectric layer 114 and at least one conductive layer 112, in which the conductive layer 112 is disposed in the dielectric layer 114. The dielectric layer 114 may be formed from $SiO_x$, $SiO_xC_yH_z$, $SiO_xC_y$, $SiC_x$, $SiN_x$, or a low dielectric constant (K) material. The conductive layer 112 may be formed from metal, such as Cu, Ni, Co, Ru, Ir, Al, Pt, Pd, Au, Ag, Os, W, Mn, or alloys thereof. In some certain examples, the conductive layer 112 may include an implant region. Each conductive layer 112 has a top surface 112t, in which the top surface 112t is not covered by the dielectric layer 114. The top surface 112t of the conductive layer 112 has a first portion 112a and a second portion 112b.

The dielectric layer 130 is disposed on portions of the substrate 110. In some exemplary examples, as shown in FIG. 1, the semiconductor device 100 may optionally include an etching stop layer 120, in which the etching stop layer 120 is disposed between the substrate 110 and the dielectric layer 130. The etching stop layer 120 has an etch selectivity with respect to the dielectric layer 130. The dielectric layer 130 has one or more via holes 132. The via holes 132 may correspond to the conductive layers 112 respectively, and each of the via holes 132 extends from the dielectric layer 130 passing through the etching stop layer 120 to the top surface 112t of the conductive layer 112 and exposes a second portion 112b of the top surface 112t of the conductive layer 112. Thus, the etching stop layer 120 and the dielectric layer 130 are disposed on the dielectric layer 114 and the first portions 112a of the top surfaces 112t of the conductive layers 112. A dielectric constant value of the dielectric layer 130 may be in a range substantially from 1.0 to 3.8. For example, the dielectric layer 130 may be formed from $SiO_x$, $SiO_xC_yH_z$, $SiO_xC_y$, $SiC_x$, $SiN_x$, or a low-K material.

In some examples, as shown in FIG. 1, the semiconductor device 100 may optionally include one or more barrier layers 170. Each of the barrier layers 170 covers a sidewall 132s and a bottom 132b of the via hole 132 and a portion of a top surface 130t of the dielectric layer 130. In some exemplary examples, each of the barrier layers 170 conformally covers the sidewall 132s and the bottom 132b of the via hole 132 and the portion of the top surface 130t of the dielectric layer 130. The barrier layers 170 are suitable to prevent the material of the vias 140, which are disposed in the via holes 132, from diffusing to the dielectric layer 130 and/or the dielectric layer 114 of the substrate 110. For example, the barrier layers 170 may be formed from $TaN_x$.

Referring to FIG. 1 again, the vias 140 are respectively disposed on the barrier layers 170 in the via holes 132 which are formed in the dielectric layer 130 and the etching stop layer 120. The via holes 132 respectively expose the second portions 112b of the top surfaces 112t of the conductive layers 112, such that the vias 140 are respectively disposed on the second portions 112b of the top surfaces 112t of the conductive layers 112. Each of the barrier layers 170 is disposed between the via 140 and the dielectric layer 130, between the via 140 and the conductive layer 112, and between the via 140 and the etching stop layer 120. For example, the vias 140 may be formed from metal, such as Cu, Ni, Co, Ru, Ir, Al, Pt, Pd, Au, Ag, Os, W, Mn, or alloys thereof.

Optionally, as shown in FIG. 1, the semiconductor device 100 may include one or more capping layers 180. The capping layers 180 respectively cover top surfaces 140t of the vias 140. In some exemplary examples, the capping layers 180 have an etch selectivity with respect to the vias 140. The capping layers 180 may be formed from a conductive material. For example, the capping layers 180 are formed from graphene. A thickness of each of the capping layers 180 may be in a range substantially from 3 angstroms to 30 angstroms.

The lines 150 are respectively disposed on the capping layers 180 on the vias 140 and the barrier layers 170 on the portions of the dielectric layer 130, such that the capping layers 180 are disposed between the lines 150 and the vias 140, and the barrier layers 170 are disposed between the lines 150 and the portions of the dielectric layer 130. The lines 150 have an etch selectivity with respect to the capping layers 180. For example, the lines 150 may be formed from metal, such as Cu, Ni, Co, Ru, Ir, Al, Pt, Pd, Au, Ag, Os, W, Mn, or alloys thereof.

Each of the capping layers 160 is disposed on a top surface 150t of the line 150 and peripherally encloses a side surface 150s of the line 150. The capping layers 160 have an etch selectivity with respect to the lines 150. In some examples, the capping layers 160 are formed from a conductive material. For example, the capping layers 160 are formed from graphene. A thickness of each of the capping layers 160 may be in a range substantially from 3 angstroms to 30 angstroms.

In some examples, as shown in FIG. 1, the semiconductor device 100 may include a dielectric layer 190. The dielectric layer 190 is disposed on the dielectric layer 130 and the capping layers 160 to peripherally enclose the lines 150. The dielectric layer 190 may have at least one via hole 196. The via hole 196 extends from the dielectric layer 190 to the capping layer 160 or to the line 150, that is a bottom 196b of the via hole 196 exposes the capping layer 160 or the line 150. For example, the dielectric layer 190 may be formed from $SiO_x$, $SiO_xC_yH_z$, $SiO_xC_y$, $SiC_x$, $SiN_x$, or a low-K material. The dielectric layer 190 may be a single-layered structure. In some exemplary examples, as shown in FIG. 1, the dielectric layer 190 includes a first dielectric layer 192 and a second dielectric layer 194, in which the first dielectric layer 192 is disposed on the dielectric layer 130 to peripherally enclose the lines 150, the second dielectric layer 194 is disposed on the first dielectric layer 192 and the capping layer 160, and the via hole 196 is formed in the second dielectric layer 194 over the line 150.

The capping layers 180 has an etch selectivity with respect to the lines 150, such that the capping layers 180 may prevent the vias 140 from being damaged during a patterning process of the lines 150. Furthermore, the capping layers 160 have an etch selectivity with respect to the lines 150, such that liner layers and barrier layers are omitted, thereby enhancing the RC performance of the semiconductor device 100 and reducing the fabrication cost. Moreover, the capping layers 160 is used as etching stop layers during a patterning process of the via hole 196, such that an additional etching stop layer is omitted, thereby preventing the capacitance impact and reducing the fabrication cost.

Figure 2:
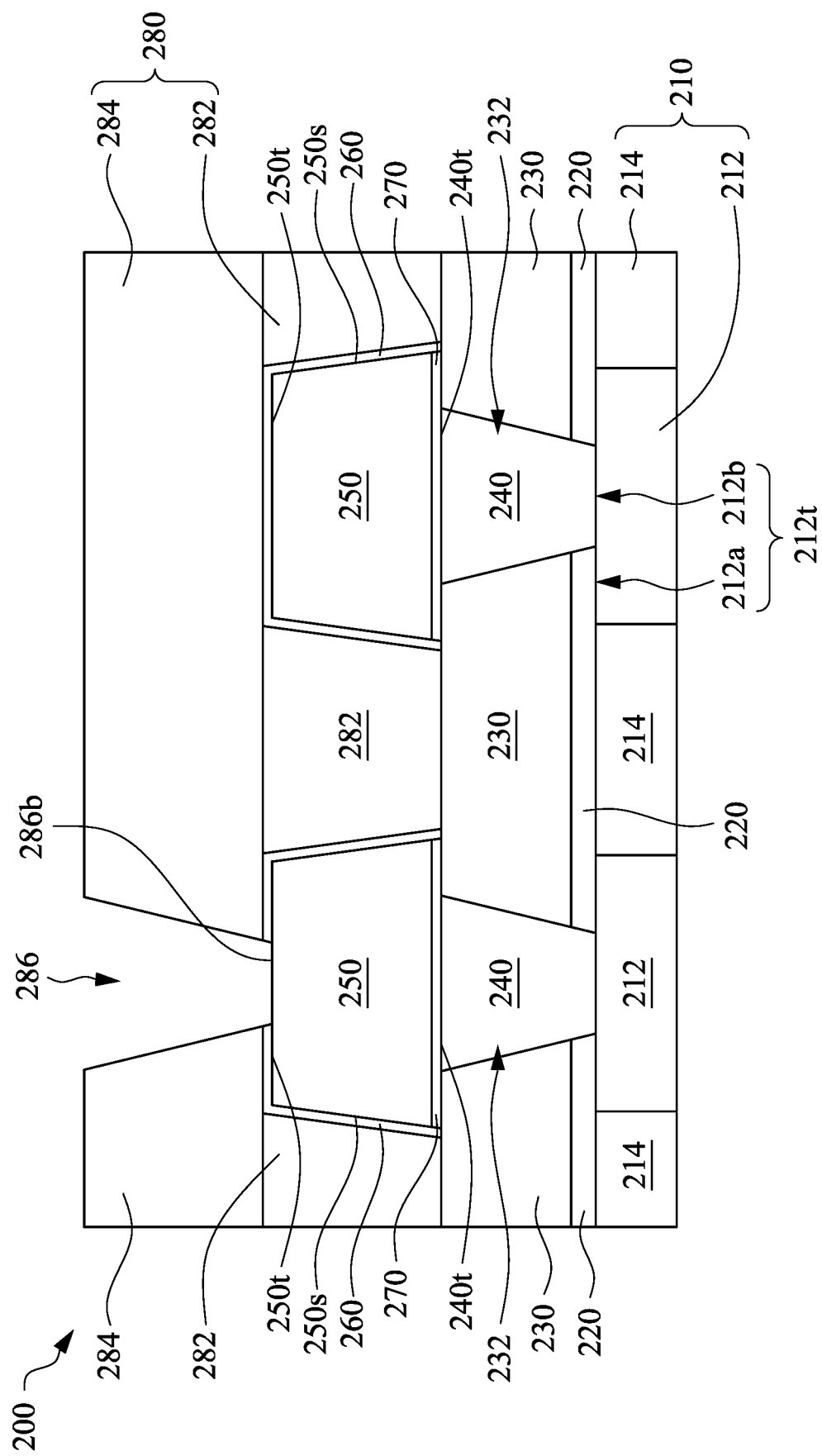
FIG. 2 is a schematic cross-sectional view of a semiconductor device in accordance with various embodiments.

FIG. 2 is schematic cross-sectional view of a semiconductor device in accordance with various embodiments. In some embodiments, a semiconductor device 200 includes a substrate 210, a dielectric layer 230, one or more vias 240, one or more lines 250, and one or more capping layers 260. In some exemplary examples, the substrate 210 includes at least one dielectric layer 214 and at least one conductive layer 212, in which the conductive layer 212 is disposed in the dielectric layer 214. The dielectric layer 214 may be formed from $SiO_x$, $SiO_xC_yH_z$, $SiO_xC_y$, $SiC_x$, $SiN_x$, or a low-K material. The conductive layer 212 may be formed from metal, such as Cu, Ni, Co, Ru, Ir, Al, Pt, Pd, Au, Ag, Os, W, Mn, or alloys thereof. In certain examples, the conductive layer 212 may include an implant region. Each conductive layer 212 has a top surface 212t, which is not covered by the dielectric layer 214. The top surface 212t of the conductive layer 212 has a first portion 212a and a second portion 212b.

As shown in FIG. 2, the dielectric layer 230 is disposed on portions of the substrate 210. Optionally, the semiconductor device 200 may include an etching stop layer 220, in which the etching stop layer 220 is disposed between the substrate 210 and the dielectric layer 230. The etching stop layer 220 has an etch selectivity with respect to the dielectric layer 230. The dielectric layer 230 has one or more via holes 232. The via holes 232 may correspond to the conductive layers 212 respectively, and each of the via holes 232 extends from the dielectric layer 230 passing through the etching stop layer 220 to the top surface 212$t$ of the conductive layer 212 and exposes a second portion 212$b$ of the top surface 212$t$ of the conductive layer 212. Thus, the etching stop layer 220 and the dielectric layer 230 are disposed on the dielectric layer 214 and the first portions 212$a$ of the top surfaces 212$t$ of the conductive layers 212. A dielectric constant value of the dielectric layer 230 may be in a range substantially from 1.0 to 3.8. For example, the dielectric layer 230 may be formed from $SiO_x$, $SiO_xC_yH_z$, $SiO_xC_y$, $SiC_x$, $SiN_x$, or a low-K material.

Referring to FIG. 2 again, the vias 240 are respectively disposed in the via holes 232 which are formed in the dielectric layer 230 and the etching stop layer 220. The via holes 232 respectively expose the second portions 212$b$ of the top surfaces 212$t$ of the conductive layers 212, such that the vias 240 are respectively disposed on the second portions 212$b$ of the top surfaces 212$t$ of the conductive layers 212. For example, the vias 240 may be formed from metal, such as Cu, Ni, Co, Ru, Ir, Al, Pt, Pd, Au, Ag, Os, W, Mn, or alloys thereof.

In some examples, as shown in FIG. 2, the semiconductor device 200 may optionally include one or more barrier layers 270. The barrier layers 270 respectively cover top surfaces 240$t$ of the vias 240, and portions of the dielectric layer 230. The barrier layers 270 are suitable to prevent the material of the vias 240 from diffusing. For example, the barrier layers 270 may be formed from $TaN_x$.

The lines 250 are respectively disposed on the barrier layers 270 on the vias 240 and the portions of the dielectric layer 230, such that the barrier layers 270 are disposed between the lines 250 and the vias 240, and between the lines 250 and the portions of the dielectric layer 230. A material of the vias 240 is different from a material of the lines 250, and the lines 250 have an etch selectivity with respect to the vias 240. For example, the lines 250 may be formed from metal, such as Cu, Ni, Co, Ru, Ir, Al, Pt, Pd, Au, Ag, Os, W, Mn, or alloys thereof.

Each of the capping layers 260 is disposed on a top surface 250$t$ of the line 250 and peripherally encloses a side surface 250$s$ of the line 250. The capping layers 260 have an etch selectivity with respect to the lines 250. In some examples, the capping layers 260 are formed from a conductive material. For example, the capping layers 260 are formed from graphene. A thickness of each of the capping layers 260 may be in a range substantially from 3 angstroms to 30 angstroms.

In some examples, as shown in FIG. 2, the semiconductor device 200 may include a dielectric layer 280. The dielectric layer 280 is disposed on the dielectric layer 230 and the capping layers 260 to peripherally enclose the lines 250. The dielectric layer 280 may have at least one via hole 286. The via hole 286 extends from the dielectric layer 280 to the capping layer 260 or to the line 250, that is a bottom 286$b$ of the via hole 286 exposes the capping layer 260 or the line 250. For example, the dielectric layer 280 may be formed from $SiO_x$, $SiO_xC_yH_z$, $SiO_xC_y$, $SiC_x$, $SiN_x$, or a low-K material. The dielectric layer 280 may be a single-layered structure. In some exemplary examples, as shown in FIG. 2, the dielectric layer 280 includes a first dielectric layer 282 and a second dielectric layer 284, in which the first dielectric layer 282 is disposed on the dielectric layer 230 to peripherally enclose the lines 250, the second dielectric layer 284 is disposed on the first dielectric layer 282 and the capping layer 260, and the via hole 286 is formed in the second dielectric layer 284 over the line 250.

The vias 240 have an etch selectivity with respect to the lines 250, such that it may prevent the vias 240 from being damaged during a patterning process of the lines 250. Furthermore, the capping layers 260 have an etch selectivity with respect to the lines 250, such that the semiconductor device 200 does not need additional liner layers and barrier layers, thereby enhancing the RC performance of the semiconductor device 100 and reducing the fabrication cost. Moreover, the capping layers 260 is used as etching stop layers during a patterning process of the via hole 286, such that an additional etching stop layer is omitted, thereby preventing the capacitance impact and reducing the fabrication cost.

Figure 3A:
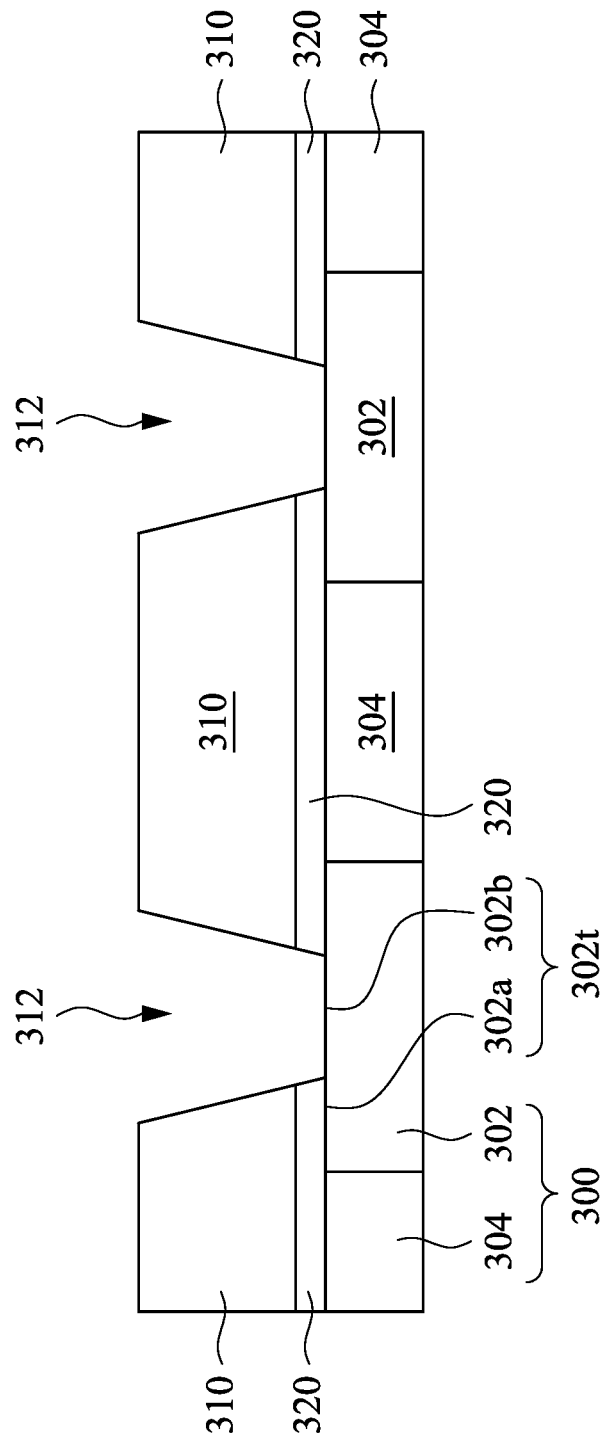
FIG. 3A through FIG. 3I are schematic cross-sectional views of intermediate stages showing a method for manufacturing a semiconductor device in accordance with various embodiments.

FIG. 3A through FIG. 3I are schematic cross-sectional views of intermediate stages showing a method for manufacturing a semiconductor device in accordance with various embodiments. As shown in FIG. 3A, a substrate 300 is provided. In some exemplary examples, the substrate 300 is provided to include at least one dielectric layer 304 and at least one conductive layer 302, in which the conductive layer 302 is formed in the dielectric layer 304. The dielectric layer 304 may be formed from $SiO_x$, $SiO_xC_yH_z$, $SiO_xC_y$, $SiC_x$, $SiN_x$, or a low-K material. The conductive layer 302 may be formed from metal, such as Cu, Ni, Co, Ru, Ir, Al, Pt, Pd, Au, Ag, Os, W, Mn, or alloys thereof. In some certain examples, the conductive layer 302 may be formed to include an implant region. A top surface 302$t$ of the conductive layer 302 is not covered by the dielectric layer 304. The top surface 302$t$ of the conductive layer 302 is formed to have a first portion 302$a$ and a second portion 302$b$.

Referring to FIG. 3A again, a dielectric layer 310 is formed on portions of the substrate 300 by using, for example, a chemical vapor deposition (CVD) process or plasma-enhanced chemical vapor deposition (PECVD) process. In some exemplary examples, a process temperature in forming the dielectric layer 310 is substantially equal to or smaller than 425 degrees centigrade. In some examples, before forming the dielectric layer 310, an etching stop layer 320 may be optionally formed to cover the substrate 300, such that the etching stop layer 320 is disposed between the substrate 300 and the dielectric layer 310. The etching stop layer 320 has an etch selectivity with respect to the dielectric layer 310. A dielectric constant value of the dielectric layer 310 may be in a range substantially from 1.0 to 3.8. For example, the dielectric layer 310 may be formed from $SiO_x$, $SiO_xC_yH_z$, $SiO_xC_y$, $SiC_x$, $SiN_x$, or a low-K material.

Figure 3B:
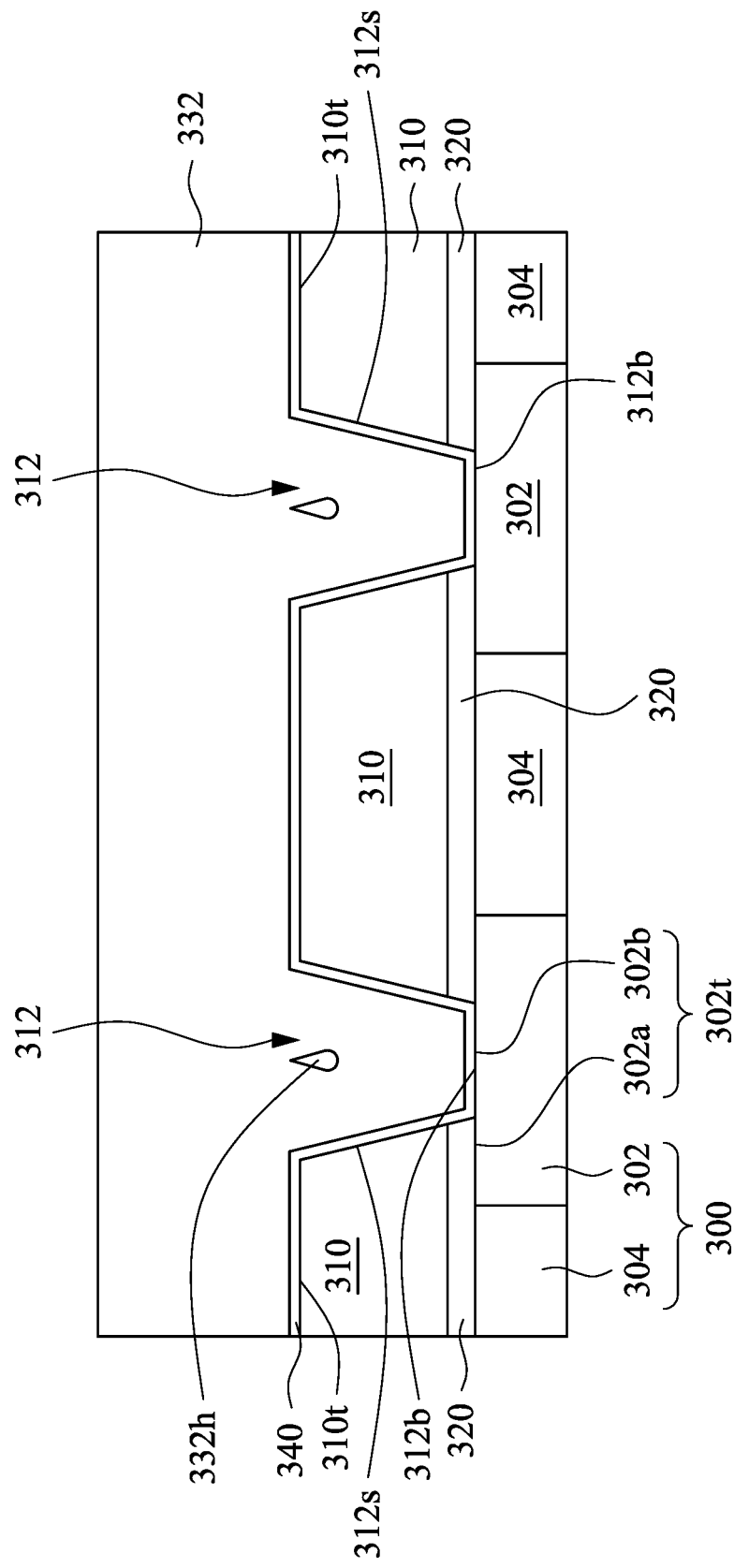
Figure 3C:
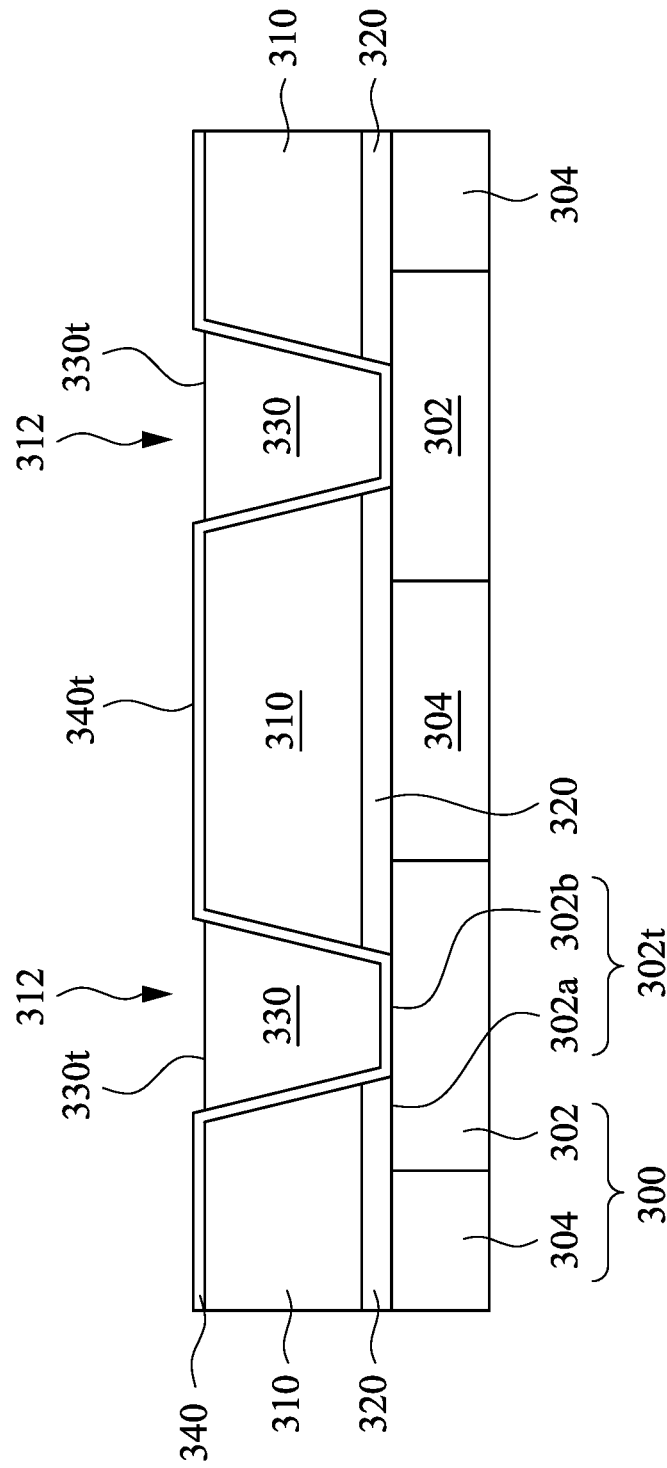

After the dielectric layer 310 is formed on the etching stop layer 320, as shown in FIG. 3C, one or more vias 330 are formed in the dielectric layer 310 on the second portions 302$b$ of the top surfaces 302$t$ of the conductive layers 302 respectively. In some examples, in forming the vias 330, one or more via holes 312 are formed in the dielectric layer 310 and the etching stop layer 320 by using, for example, a photolithography technique and an etch technique. The via holes 312 correspond to the conductive layers 302 respectively, and each of the via holes 312 extends from the dielectric layer 310 passing through the etching stop layer 320 to the top surface 302$t$ of the conductive layer 302 and exposes the second portion 302$b$ of the top surface 302$t$ of the conductive layer 302. After the via holes 312 are completed, the etching stop layer 320 and the dielectric layer 310 are located on the dielectric layer 304 and the first portions 302a of the top surfaces 302t of the conductive layers 302.

As shown in FIG. 3B, after the via holes 312 are formed, a barrier layer 340 may be optionally formed to cover a sidewall 312s and a bottom 312b of each of the via holes 312 and a top surface 310t of the dielectric layer 310. In some exemplary examples, the barrier layer 340 conformally covers the sidewalls 312s and the bottoms 312b of the via holes 312 and the top surface 310t of the dielectric layer 310. The barrier layer 340 is suitable to prevent the material of the vias 330, which are disposed in the via holes 312, from diffusing to the dielectric layer 310 and/or the dielectric layer 304 of the substrate 300. For example, the barrier layer 340 may be formed by using a chemical vapor deposition process or a plasma-enhanced chemical vapor deposition process. The barrier layer 340 may be formed from $TaN_x$.

Referring to FIG. 3B again, a via material layer 332 is formed on the barrier layer 340 to fill the via holes 312 with the via material layer 332. For example, the via material layer 332 may be formed by using an atomic layer deposition (ALD) process, a chemical vapor deposition process, or an electroless deposition (ELD) process. The via material layer 332 may be formed from metal, such as Cu, Ni, Co, Ru, Ir, Al, Pt, Pd, Au, Ag, Os, W, Mn, or alloys thereof. Optionally, after the via material layer 332 is completed, the via material layer 332 may be annealed to eliminate holes 332h which may be formed in the via material layer 332. In some exemplary examples, process temperatures in forming and annealing the via material layer 332 are substantially equal to or smaller than 425 degrees centigrade.

As shown in FIG. 3C, a portion of the via material layer 332, which is disposed on the barrier layer 340 on the top surface 310t of the dielectric layer 310, is removed to form the vias 330 respectively in the via holes 312. Thus, the vias 330 are formed in the dielectric layer 310 on the second portions 302b of the top surfaces 302t of the conductive layers 302. The portion of the via material layer 332 may be removed by using a polishing technique or an etch technique. For example, a chemical mechanical polishing process may be performed on the via material layer 332 to remove the portion of the via material layer 332. A top surface 330t of each of the vias 330 may be elevated at the same level with a top 340t of the barrier layer 340. The top surface 330t of each of the vias 330 may be lower than the top 340t of the barrier layer 340. In certain examples, the top surface 330t of each of the vias 330 may be higher than the top 340t of the barrier layer 340.

Figure 3D:
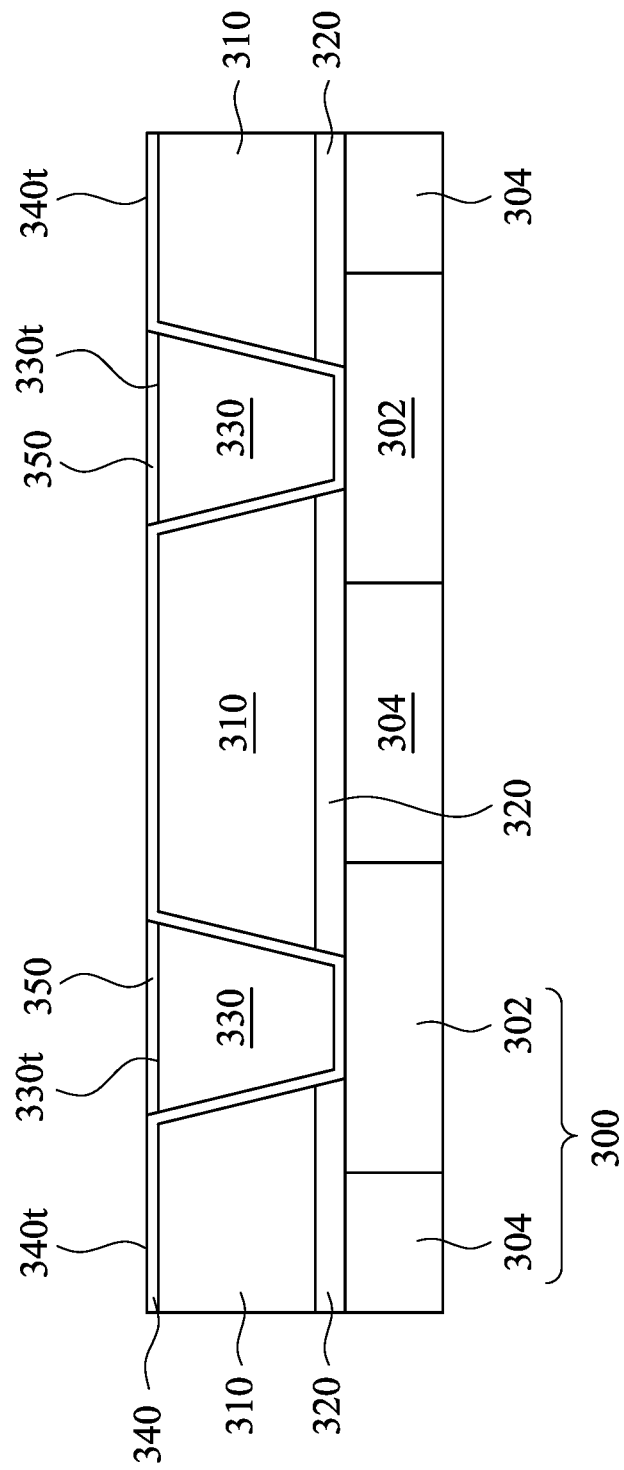

As shown in FIG. 3D, first capping layers 350 are respectively formed on top surfaces 330t of the vias 330. The first capping layers 350 cover the top surfaces 330t of the vias 330. The first capping layers 350 may have an etch selectivity with respect to the vias 330. The first capping layers 350 may be formed from a conductive material. In some exemplary examples, the first capping layers 350 are formed from graphene. For example, the first capping layers 350 may be formed by using an atomic layer deposition process, a chemical vapor deposition process, a plasma-enhanced atomic layer deposition process, or a plasma-enhanced chemical vapor deposition process. A process temperature of forming the first capping layers 350 may be in a range substantially from 25 degrees centigrade to 1000 degrees centigrade. For example, the process temperature of forming the first capping layers 350 may be in a range substantially from 25 degrees centigrade to 425 degrees centigrade. Each of the first capping layers 350 may be formed to have a thickness substantially ranging from 3 angstroms to 30 angstroms. A top surface 350t of each of the first capping layers 350 may be lower than the top 340t of the barrier layer 340. In certain examples, the top surface 350t of each of the first capping layers 350 may be higher than or may be elevated at the same level with the top 340t of the barrier layer 340.

In some exemplary examples, the first capping layers 350 include graphene layers, and the graphene layers are formed by using a chemical vapor deposition process or a plasma-enhanced chemical vapor deposition process. The graphene layers are grown under the catalyst of the vias 330. In the chemical vapor deposition process or a plasma-enhanced chemical vapor deposition process, reactants may include $C_xH_y$ and $H_2$, a flow of the reactants may be in a range substantially from 100 sccm to 10000 sccm, a process pressure is in a range substantially from 0.1 torr to 760 torr, and a process temperature may be in a range substantially from 25 degrees centigrade to 425 degrees centigrade. In the plasma-enhanced chemical vapor deposition process, a plasma power may be in a range substantially from 50 W to 1000 W.

Figure 3E:
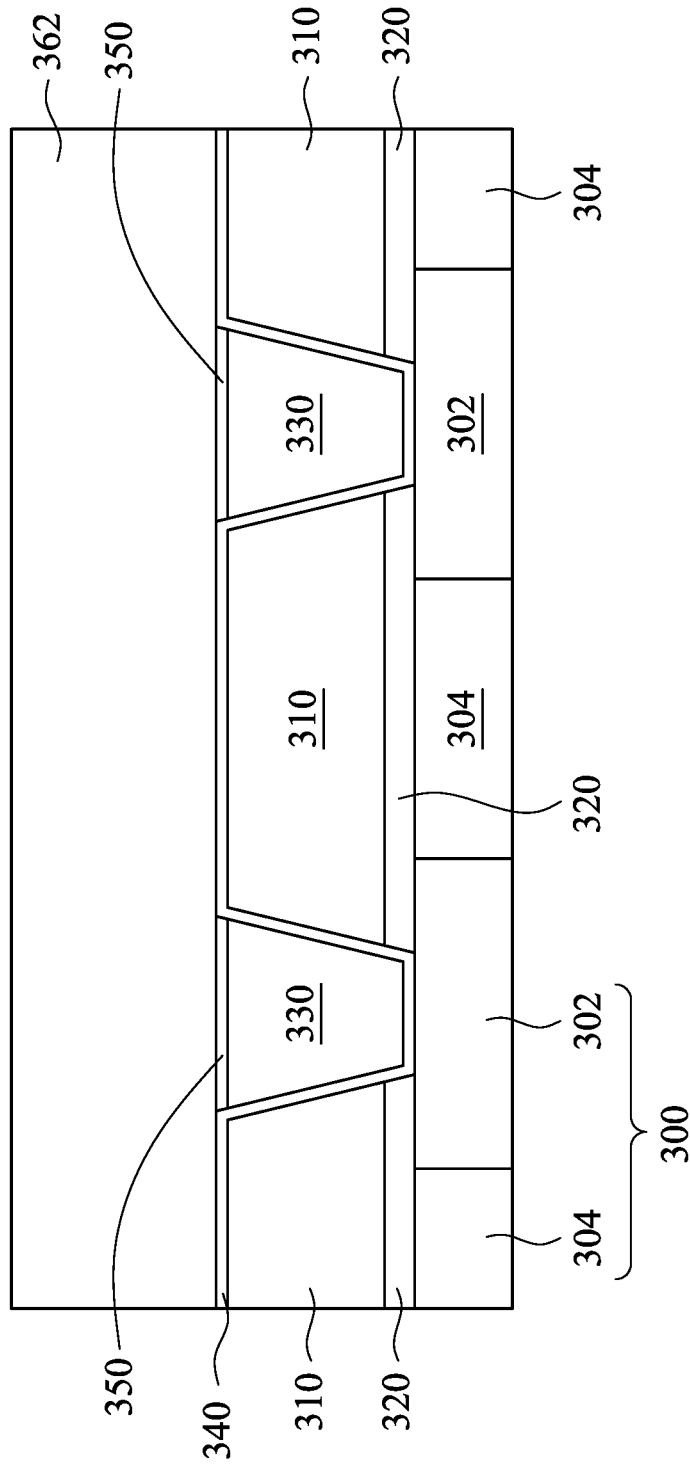
Figure 3F:
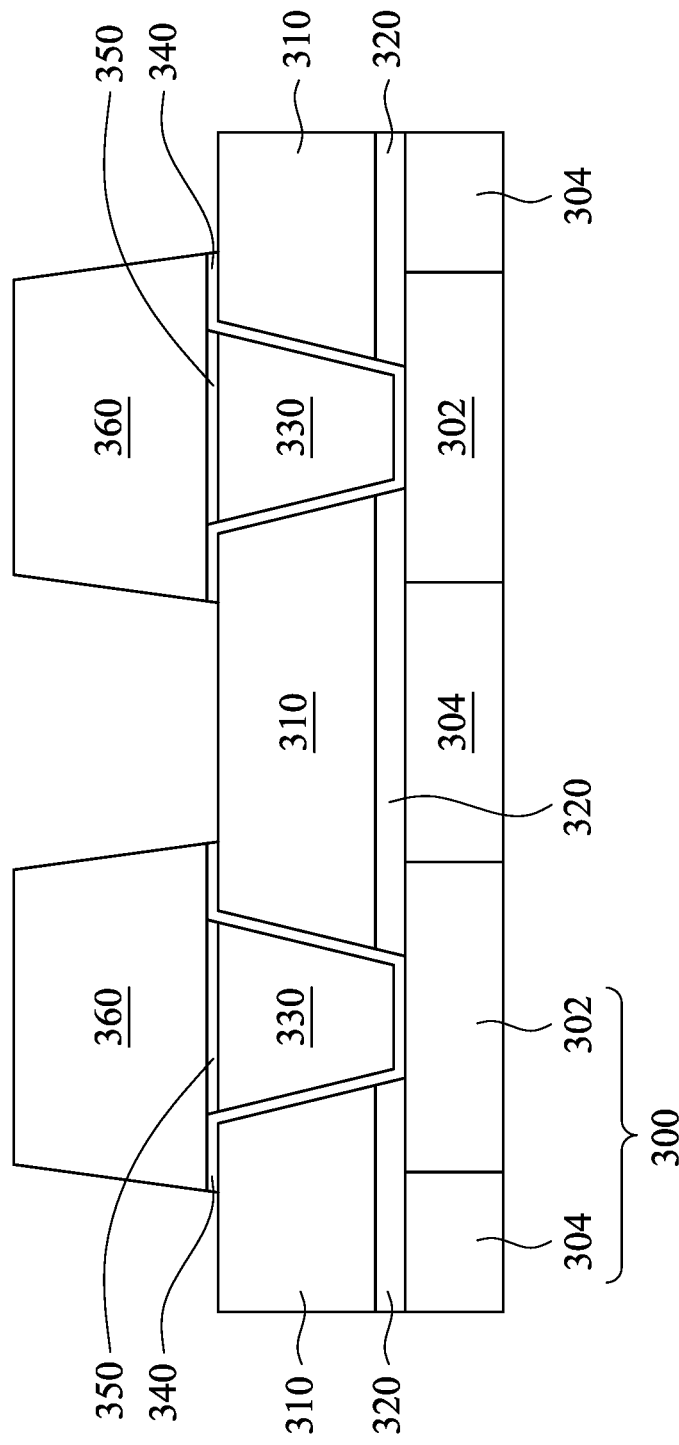

After the first capping layers 350 are completed, as shown in FIG. 3F, lines 360 are formed on the first capping layers 350 and portions of the barrier layer 340 on portions of the dielectric layer 310. In some examples, in forming the lines 360, as shown in FIG. 3E, a line material layer 362 is formed on the barrier layer 340 and the first capping layers 350. For example, the line material layer 362 may be formed by using an atomic layer deposition process, a chemical vapor deposition process, a physical vapor deposition (PVD) process, an electroless deposition process, or an electrochemical plating (ECP) process. The line material layer 362 has an etch selectivity with respect to the first capping layers 350. The line material layer 362 may be formed from metal, such as Cu, Ni, Co, Ru, Ir, Al, Pt, Pd, Au, Ag, Os, W, Mn, or alloys thereof. In some exemplary examples, a process temperature in forming the line material layer 362 is substantially equal to or smaller than 425 degrees centigrade. As shown in FIG. 3F, the line material layer 362 and the barrier layer 340 are patterned by using, for example, a photolithography technique and an etch technique. Portions of the line material layer 362 and portions of the barrier layer 340, which are underlying the portions of the line material layer 362, are removed, so as to form the lines 360 on the first capping layer 350 and the other portions of the barrier layer 340 on the dielectric layer 310.

The first capping layers 350 has an etch selectivity with respect to the line material layer 362, such that the first capping layers 350 may prevent the vias 330 from being damaged during the patterning process of the line material layer 362.

Figure 3G:
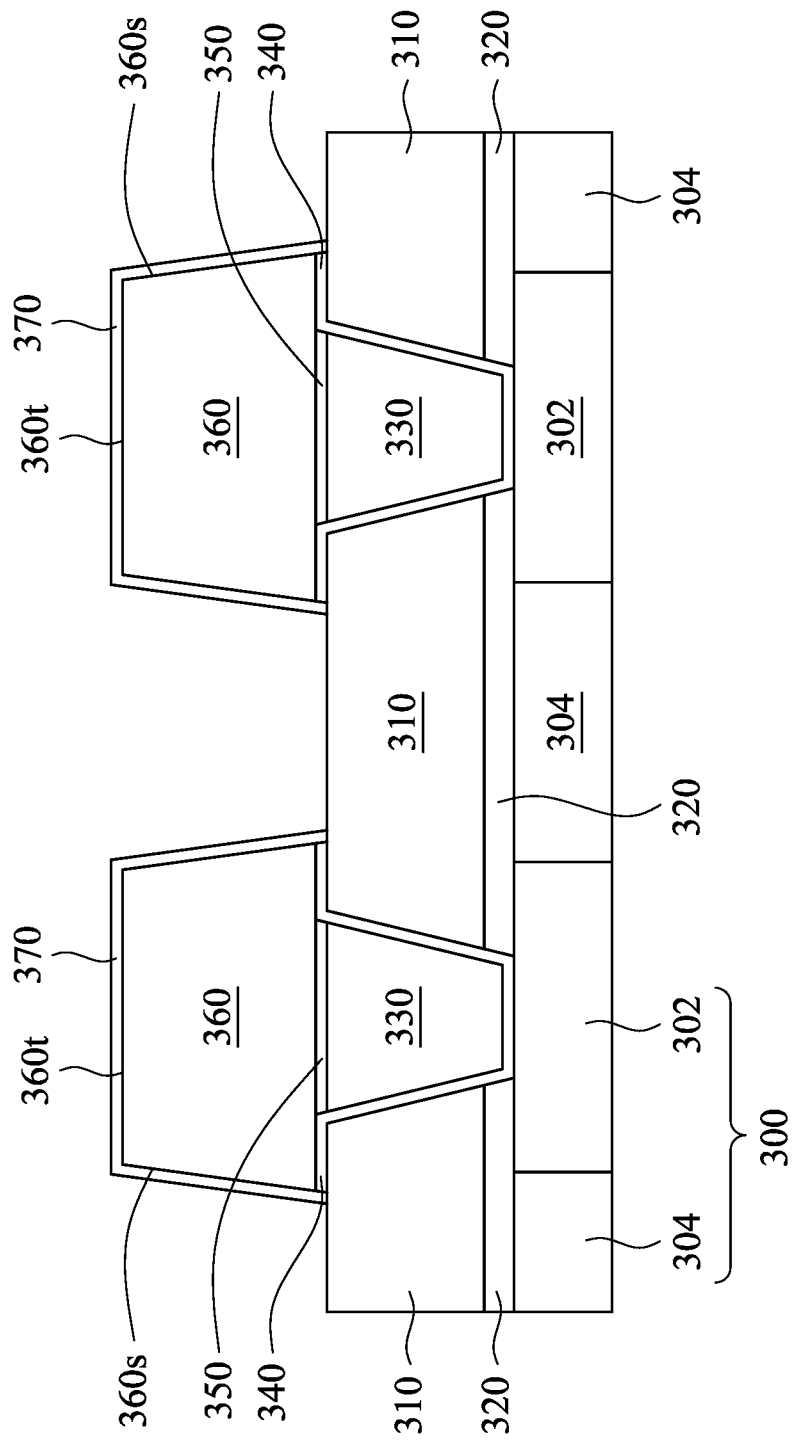

As shown in FIG. 3G, second capping layers 370 are respectively formed on top surfaces 360t of the lines 360 to peripherally enclose side surfaces 360s of the lines 360. Each of the first capping layers and the second capping layers 370 has an etch selectivity with respect to the lines 360. The second capping layers 370 may be formed from a conductive material. In some exemplary examples, the second capping layers 370 are formed from graphene. For example, the second capping layers 370 may be formed by using an atomic layer deposition process, a chemical vapor deposition process, a plasma-enhanced atomic layer deposition process, or a plasma-enhanced chemical vapor deposition process. A process temperature of forming the second capping layers 370 may be in a range substantially from 25 degrees centigrade to 1000 degrees centigrade. For example, the process temperature of forming the second capping layers 370 may be in a range substantially from 25 degrees centigrade to 425 degrees centigrade. Each of the second capping layers 370 may be formed to have a thickness substantially ranging from 3 angstroms to 30 angstroms.

In some exemplary examples, the second capping layers 370 include graphene layers, and are formed by using a chemical vapor deposition process or a plasma-enhanced chemical vapor deposition process. The graphene layers are grown under the catalyst of the lines 360. In the chemical vapor deposition process or a plasma-enhanced chemical vapor deposition process, reactants may include $C_xH_y$ and $H_2$, a flow of the reactants may be in a range substantially from 100 sccm to 10000 sccm, a process pressure is in a range substantially from 0.1 torr to 760 torr, and a process temperature may be in a range substantially from 25 degrees centigrade to 425 degrees centigrade. In the plasma-enhanced chemical vapor deposition process, a plasma power may be in a range substantially from 50 W to 1000 W.

Figure 3H:
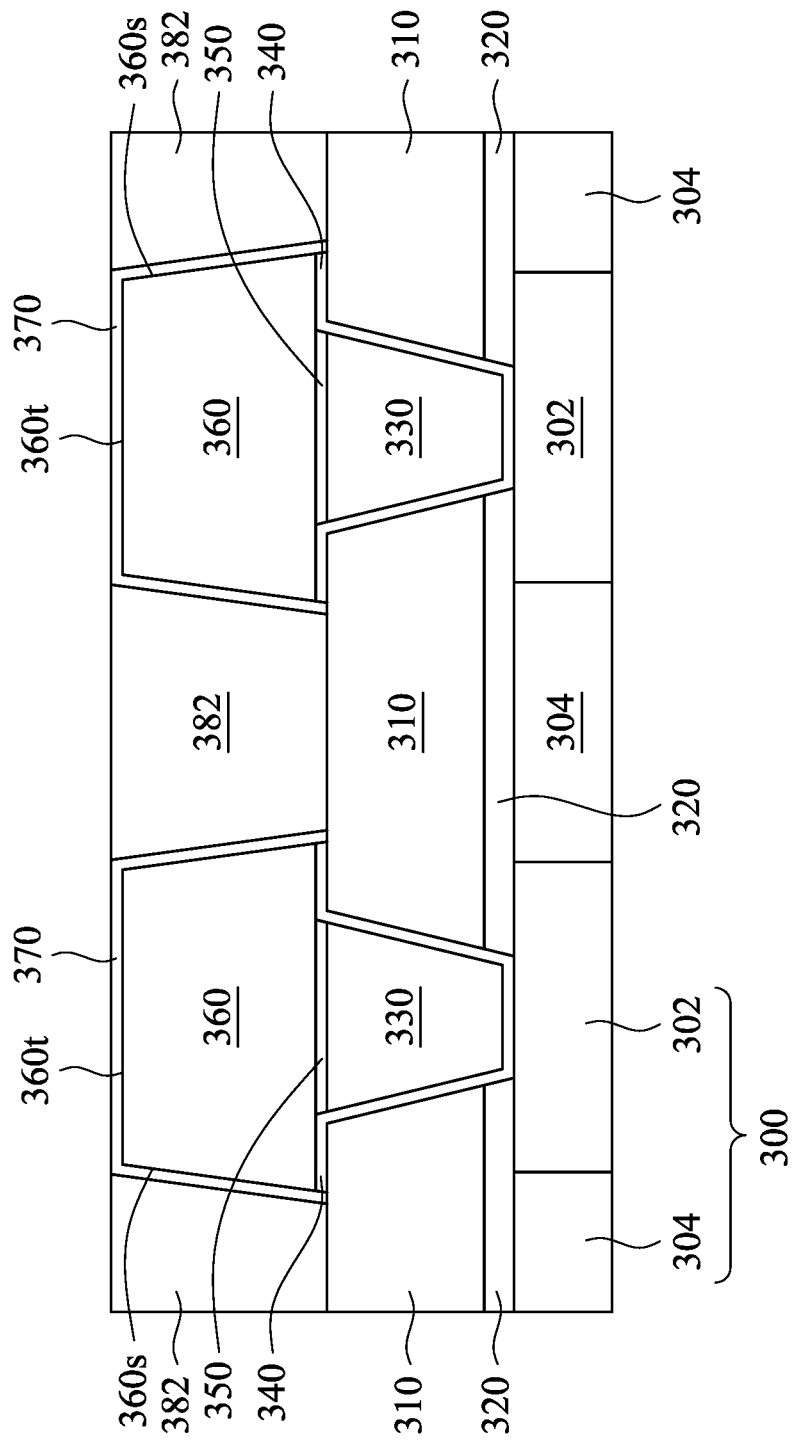
Figure 3I:
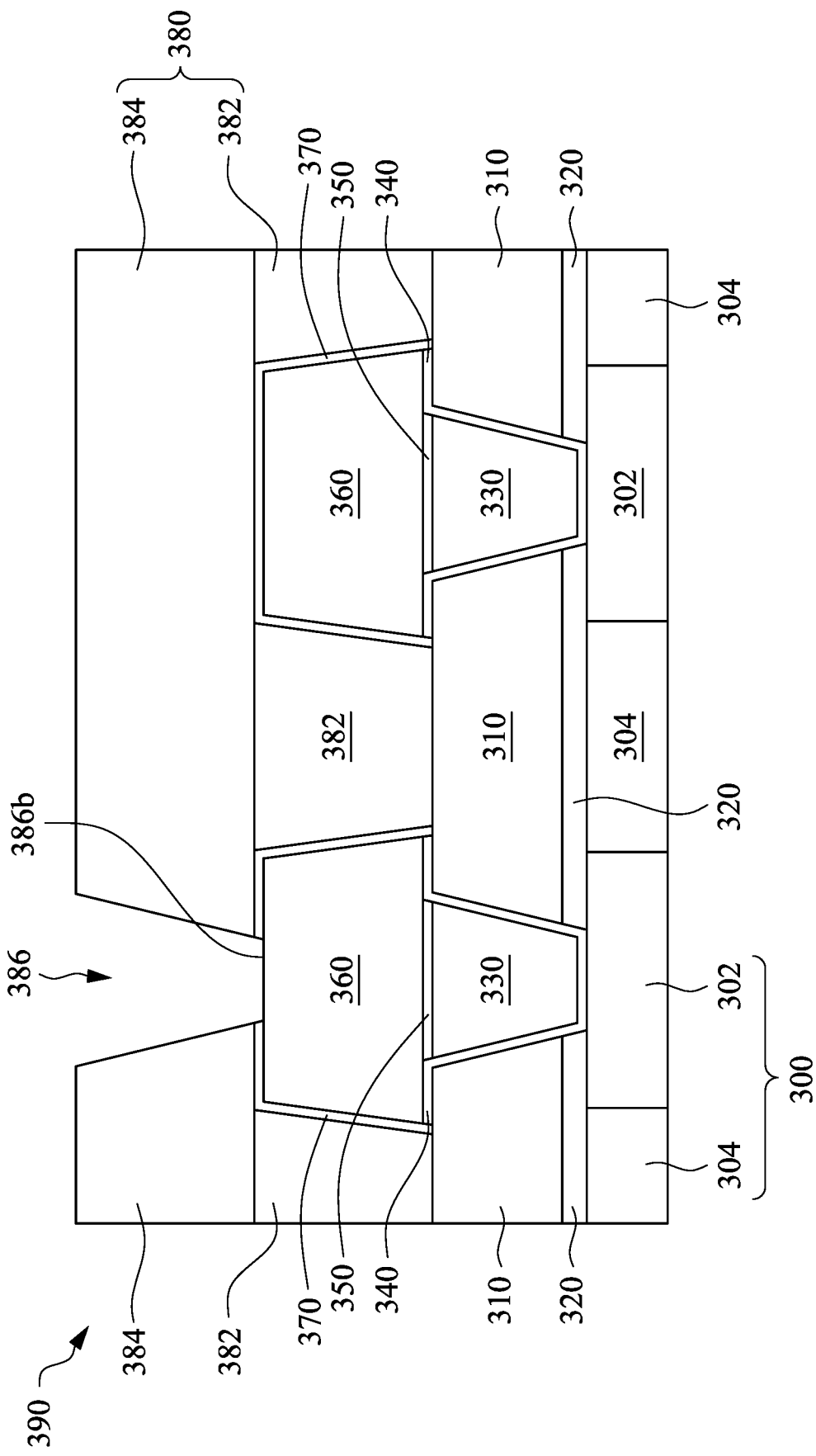

As shown in FIG. 3I, a dielectric layer 380 is formed on of the dielectric layer 310 and the second capping layers 370 to peripherally enclose the lines 360 to form a semiconductor device 390. For example, the dielectric layer 380 may be formed by using, a chemical vapor deposition process or a plasma-enhanced chemical vapor deposition process. In some exemplary examples, a process temperature in forming the dielectric layer 380 is substantially equal to or smaller than 425 degrees centigrade. A dielectric constant value of the dielectric layer 380 may be in a range substantially from 1.0 to 3.8. For example, the dielectric layer 380 may be formed from $SiO_x$, $SiO_xC_yH_z$, $SiO_xC_y$, $SiC_x$, $SiN_x$, or a low-K material. The dielectric layer 380 may be a single-layered structure. At least one via hole 386 is formed in the dielectric layer 380 over the line 360 by using, for example, a photolithography technique and an etch technique. The via hole 386 is formed to extend from the dielectric layer 380 to the second capping layer 370 or to the line 360, that is the via hole 386 is formed to have a bottom 386b which exposes the second capping layer 370 or the line 360.

In some exemplary examples, the dielectric layer 380 is formed to include at least two dielectric layers, such as a first dielectric layer 382 and a second dielectric layer 384. As shown in FIG. 3H, in forming the dielectric layer 380, the first dielectric layer 382 is formed on the dielectric layer 310 to peripherally enclose the lines 360. Portions of the second capping layers 370, which are located on top surfaces 360t of the lines 360, may not be covered by the first dielectric layer 382. As shown in FIG. 3I, the second dielectric layer 384 is formed on the first dielectric layer 382 and the second capping layers 370. The via hole 386 is formed in the second dielectric layer 384 over the line 360.

The second capping layers 370 have an etch selectivity with respect to the lines 360, such that the semiconductor device 390 does not need additional liner layers and barrier layers, thereby enhancing the RC performance of the semiconductor device 390 and reducing the fabrication cost. Moreover, the second capping layers 370 is used as etching stop layers during the patterning process of the via hole 386, such that an additional etching stop layer is omitted, thereby preventing the capacitance impact and reducing the fabrication cost.

Figure 4:
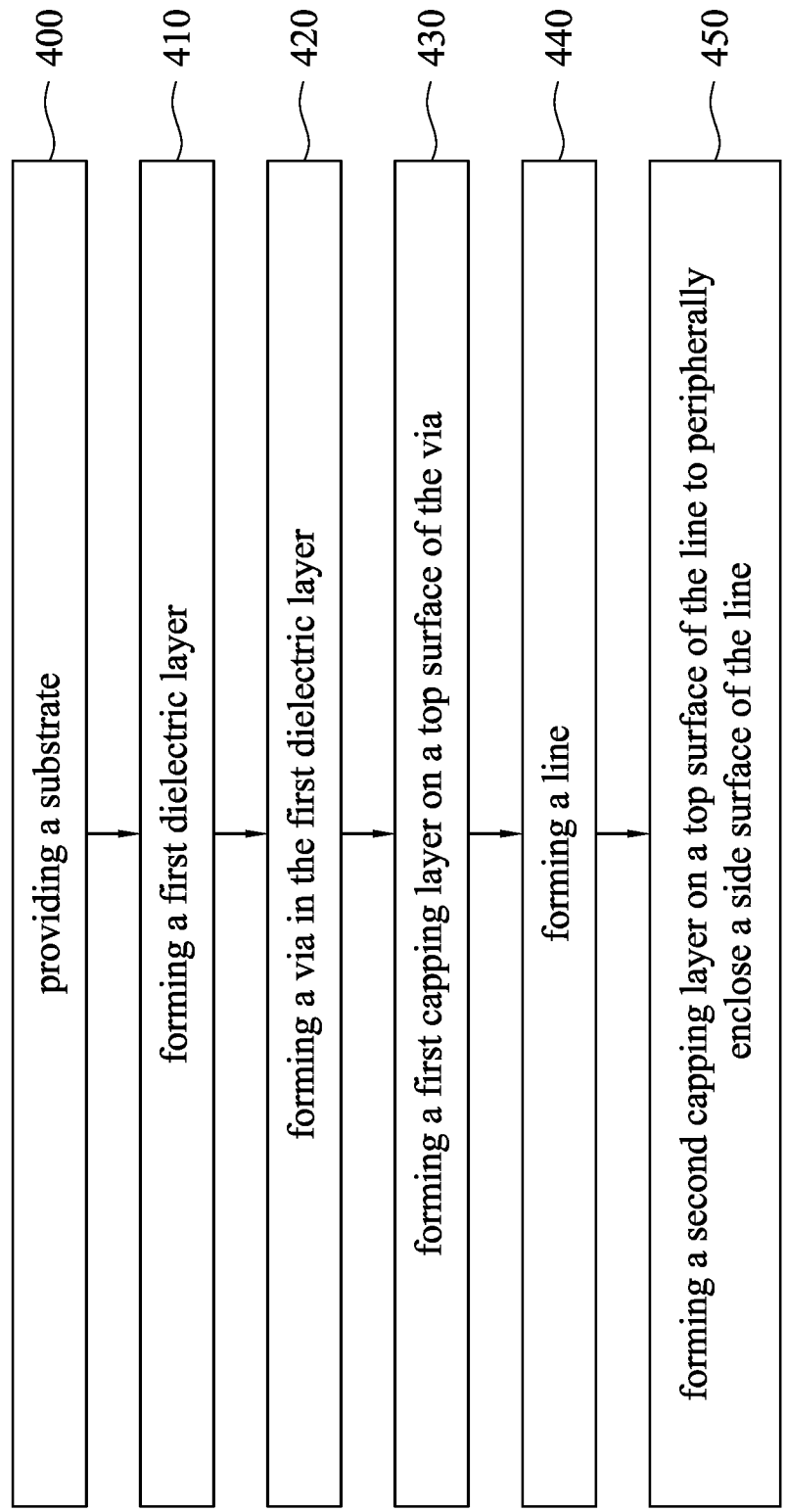
FIG. 4 is a flow chart of a method for manufacturing a semiconductor device in accordance with various embodiments.

Referring to FIG. 4 with FIG. 3A through FIG. 3I, FIG. 4 is a flow chart of a method for manufacturing a semiconductor device in accordance with various embodiments. The method begins at operation 400, where a substrate 300 is provided. In some exemplary examples, the substrate 300 is provided to include at least one dielectric layer 304 and at least one conductive layer 302, in which the conductive layer 302 is formed in the dielectric layer 304. A top surface 302t of the conductive layer 302 is not covered by the dielectric layer 304. The top surface 302t of the conductive layer 302 is formed to have a first portion 302a and a second portion 302b.

At operation 410, as shown in FIG. 3A, a dielectric layer 310 is formed on portions of the substrate 300 by using, for example, a chemical vapor deposition process or a plasma-enhanced chemical vapor deposition process. In some examples, before forming the dielectric layer 310, an etching stop layer 320 may be optionally formed to cover the substrate 300. The etching stop layer 320 is formed to have an etch selectivity with respect to the dielectric layer 310.

At operation 420, as shown FIG. 3C, one or more vias 330 are formed in the dielectric layer 310 on the second portions 302b of the top surfaces 302t of the conductive layers 302 respectively. In some examples, as shown in FIG. 3A, via holes 312 are firstly formed in the dielectric layer 310 and the etching stop layer 320 by using, for example, a photolithography technique and an etch technique. The via holes 312 correspond to the conductive layers 302 respectively, and each of the via holes 312 extends from the dielectric layer 310 passing through the etching stop layer 320 to the top surface 302t of the corresponding conductive layer 302 and exposes a second portion 302b of the top surface 302t of the corresponding conductive layer 302.

As shown in FIG. 3B, a barrier layer 340 may be optionally formed to cover a sidewall 312s and a bottom 312b of each of the via holes 312 and a top surface 310t of the dielectric layer 310. In some exemplary examples, the barrier layer 340 is formed to conformally cover the sidewalls 312s and the bottoms 312b of the via holes 312 and the top surface 310t of the dielectric layer 310.

Referring to FIG. 3B again, a via material layer 332 is formed on the barrier layer 340 to fill the via holes 312 with the via material layer 332. For example, the via material layer 332 may be formed by using an atomic layer deposition process, a chemical vapor deposition process, or an electroless deposition process. The via material layer 332 may be optionally annealed to eliminate holes 332h which may be formed in the via material layer 332.

As shown in FIG. 3C, a portion of the via material layer 332, which is disposed on the barrier layer 340 on the top surface 310t of the dielectric layer 310, is removed to form the vias 330 respectively in the via holes 312 by using a polishing technique or an etch technique. For example, a chemical mechanical polishing process may be performed on the via material layer 332 to remove the portion of the via material layer 332.

At operation 430, as shown FIG. 3C, first capping layers 350 are respectively formed on and cover top surfaces 330t of the vias 330. The first capping layers 350 may have an etch selectivity with respect to the vias 330. In some exemplary examples, the first capping layers 350 are formed from graphene. For example, the first capping layers 350 may be formed by using an atomic layer deposition process, a chemical vapor deposition process, a plasma-enhanced atomic layer deposition process, or a plasma-enhanced chemical vapor deposition process.

At operation 440, as shown in FIG. 3F, lines 360 are formed on the first capping layers 350 and portions of the barrier layer 340 on portions of the dielectric layer 310. In some examples, in forming the lines 360, as shown in FIG. 3E, a line material layer 362 is formed on the barrier layer 340 and the first capping layers 350 by using, for example, an atomic layer deposition process, a chemical vapor deposition process, a physical vapor deposition process, an electroless deposition process, or an electrochemical plating process. The line material layer 362 is formed to have an etch selectivity with respect to the first capping layers 350. As shown in FIG. 3F, the line material layer 362 and the barrier layer 340 are patterned to remove portions of the line material layer 362 and portions of the barrier layer 340, so as to form the lines 360 on the first capping layer 350 and the other portions of the barrier layer 340 on the dielectric layer 330.

At operation 450, as shown in FIG. 3G, second capping layers 370 are respectively formed on top surfaces 360t of the lines 360 to peripherally enclose side surfaces 360s of the lines 360. The second capping layers 370 have an etch selectivity with respect to the lines 360. In some exemplary examples, the second capping layers 370 are formed from graphene. For example, the second capping layers 370 may be formed by using an atomic layer deposition process, a chemical vapor deposition process, a plasma-enhanced atomic layer deposition process, or a plasma-enhanced chemical vapor deposition process.

In some examples, as shown in FIG. 3I, a dielectric layer 380 is formed on of the dielectric layer 310 and the second capping layers 370 to peripherally enclose the lines 360 to form a semiconductor device 390. For example, the dielectric layer 380 may be formed by using, a chemical vapor deposition process or a plasma-enhanced chemical vapor deposition process. The dielectric layer 380 may be a single-layered structure. At least one via hole 386 is formed in the dielectric layer 380 over the line 360. The via hole 386 is formed to extend from the dielectric layer 380 to the second capping layer 370 or to the line 360, that is the via hole 386 is formed to have a bottom 386b which exposes the second capping layer 370 or the line 360.

In some exemplary examples, the dielectric layer 380 is formed to include at least two dielectric layers, such as a first dielectric layer 382 and a second dielectric layer 384. As shown in FIG. 3H, in forming the dielectric layer 380, the first dielectric layer 382 is formed on the dielectric layer 310 to peripherally enclose the lines 360. Portions of the second capping layers 370, which are located on top surfaces 360t of the lines 360, may not be covered by the first dielectric layer 382. As shown in FIG. 3I, the second dielectric layer 384 is formed on the first dielectric layer 382 and the second capping layers 370. The via hole 386 is formed in the second dielectric layer 384 over the line 360.

Figure 5A:
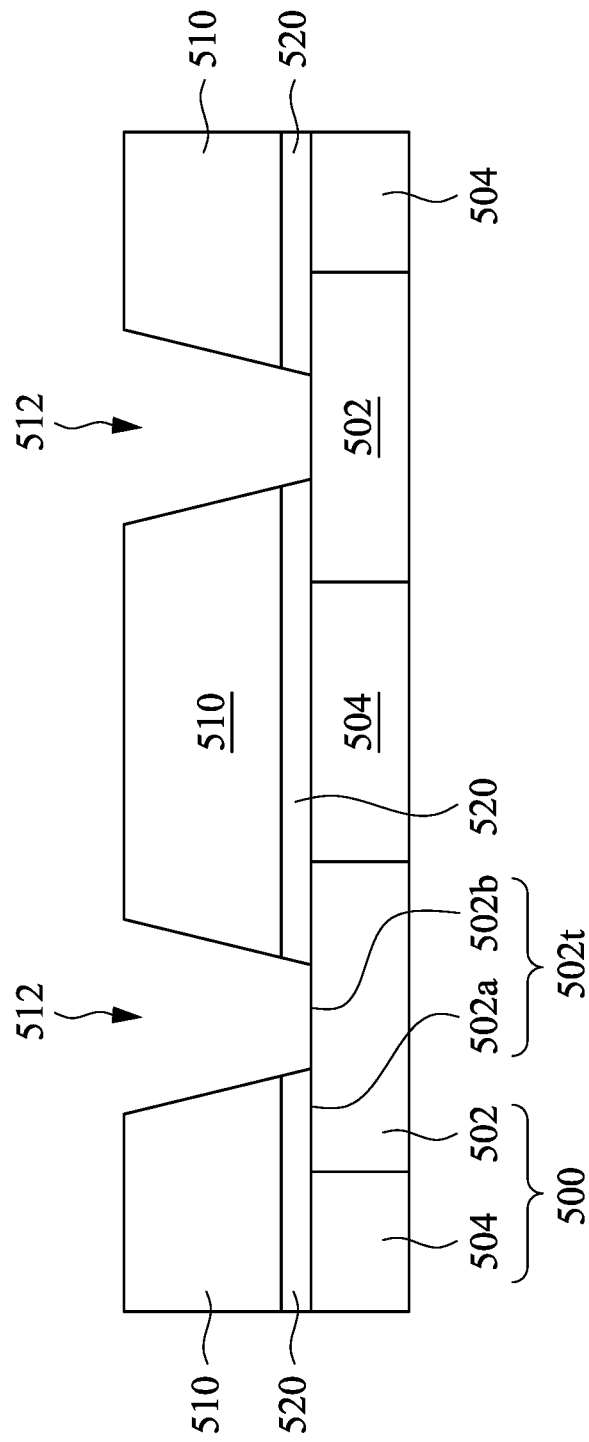
FIG. 5A through FIG. 5G are schematic cross-sectional views of intermediate stages showing a method for manufacturing a semiconductor device in accordance with various embodiments.

FIG. 5A through FIG. 5G are schematic cross-sectional views of intermediate stages showing a method for manufacturing a semiconductor device in accordance with various embodiments. As shown in FIG. 5A, a substrate 500 is provided. In some exemplary examples, the substrate 500 is provided to include at least one conductive layer 502 and at least one dielectric layer 504, in which the conductive layer 502 is formed in the dielectric layer 504, and a top surface 502t of the conductive layer 502 is not covered by the dielectric layer 504. The top surface 502t of the conductive layer 502 is formed to have a first portion 502a and a second portion 502b. The conductive layer 502 may be formed from metal, such as Cu, Ni, Co, Ru, Ir, Al, Pt, Pd, Au, Ag, Os, W, Mn, or alloys thereof. In some certain examples, the conductive layer 502 may be formed to include an implant region. The dielectric layer 504 may be formed from $SiO_x$, $SiO_xC_yH_z$, $SiO_xC_y$, $SiC_x$, $SiN_x$, or a low-K material.

Referring to FIG. 5A again, a dielectric layer 510 is formed on portions of the substrate 500 by using, for example, a chemical vapor deposition process or a plasma-enhanced chemical vapor deposition process. In some exemplary examples, a process temperature in forming the dielectric layer 510 is substantially equal to or smaller than 425 degrees centigrade. A dielectric constant value of the dielectric layer 510 may be in a range substantially from 1.0 to 3.8. For example, the dielectric layer 510 may be formed from $SiO_x$, $SiO_xC_yH_z$, $SiO_xC_y$, $SiC_x$, $SiN_x$, or a low-K material. Optionally, before forming the dielectric layer 510, an etching stop layer 520 may be formed to cover the substrate 500, such that the etching stop layer 520 is disposed between the substrate 500 and the dielectric layer 510. The etching stop layer 520 has an etch selectivity with respect to the dielectric layer 510.

Figure 5B:
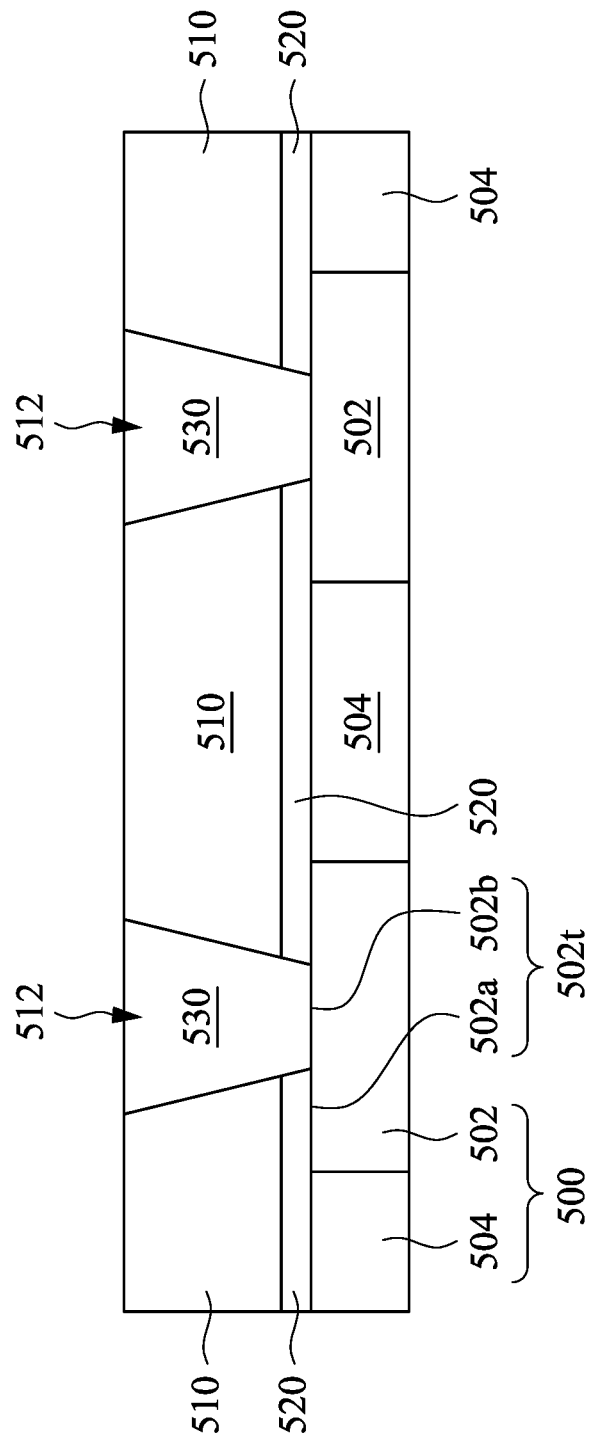

As shown in FIG. 5B, one or more vias 530 are formed in the dielectric layer 510 on the second portion 502b of the top surface 502t of the conductive layers 502 respectively. In some examples, in forming the vias 530, via holes 512 are formed in the dielectric layer 510 and the etching stop layer 520 by using, for example, a photolithography technique and an etch technique. As shown in FIG. 5A, the via holes 512 correspond to the conductive layers 502 respectively, and each of the via holes 512 extends from the dielectric layer 510 passing through the etching stop layer 520 to the top surface 502t of the conductive layer 502 and exposes the second portion 502b of the top surface 502t of the conductive layer 502. After the via holes 512 are completed, the dielectric layer 510 and the etching stop layer 520 are located on the dielectric layer 504 and the first portions 502a of the top surfaces 502t of the conductive layers 502.

As shown in FIG. 5B, the via holes 512 are respectively filled with the vias 530. For example, the vias 530 may be formed by using an atomic layer deposition process, a chemical vapor deposition process, or an electroless deposition process. The vias 530 may be formed from metal, such as Cu, Ni, Co, Ru, Ir, Al, Pt, Pd, Au, Ag, Os, W, Mn, or alloys thereof. In some exemplary examples, a process temperature in forming the vias 530 is substantially equal to or smaller than 425 degrees centigrade.

Figure 5C:
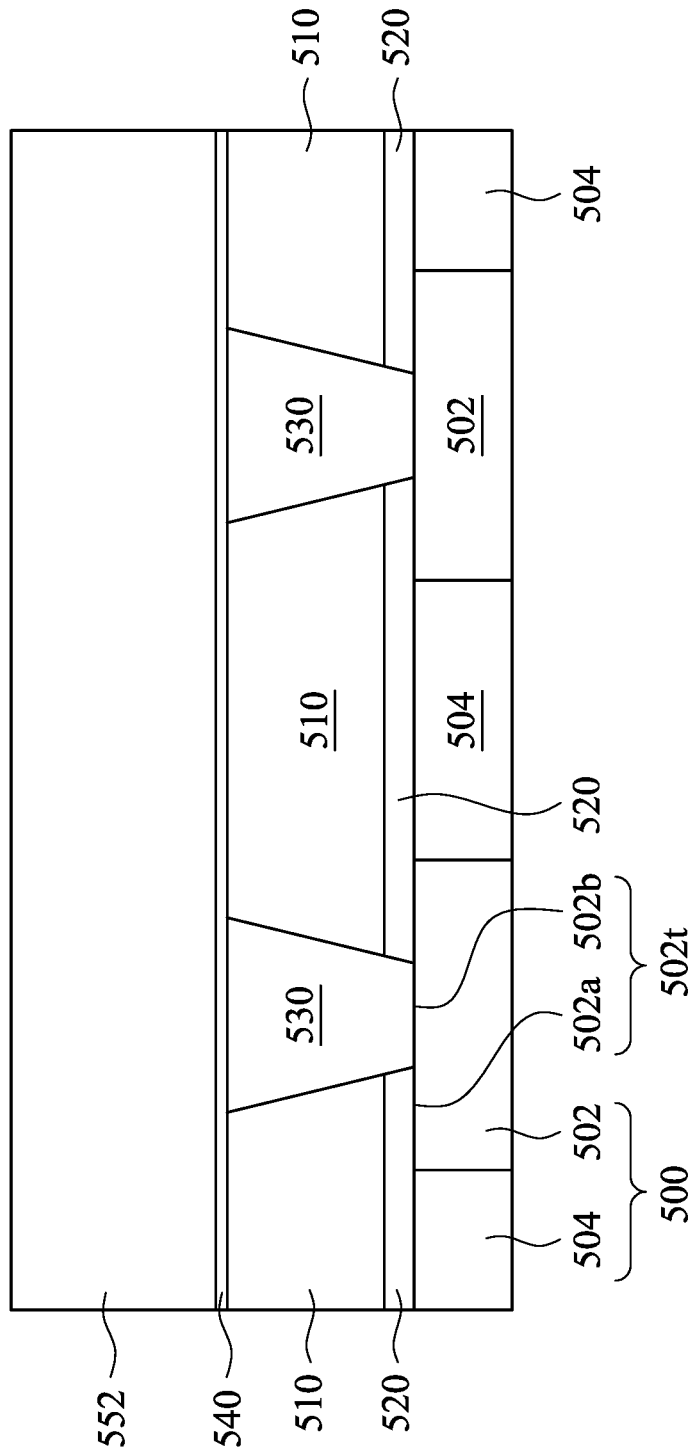

As shown in FIG. 5C, a barrier layer 540 may be optionally formed to cover the dielectric layer 510 and the vias 530. For example, the barrier layer 540 may be formed by using a chemical vapor deposition process or a plasma-enhanced chemical vapor deposition process. The barrier layer 540 may be formed from $TaN_x$.

Figure 5D:
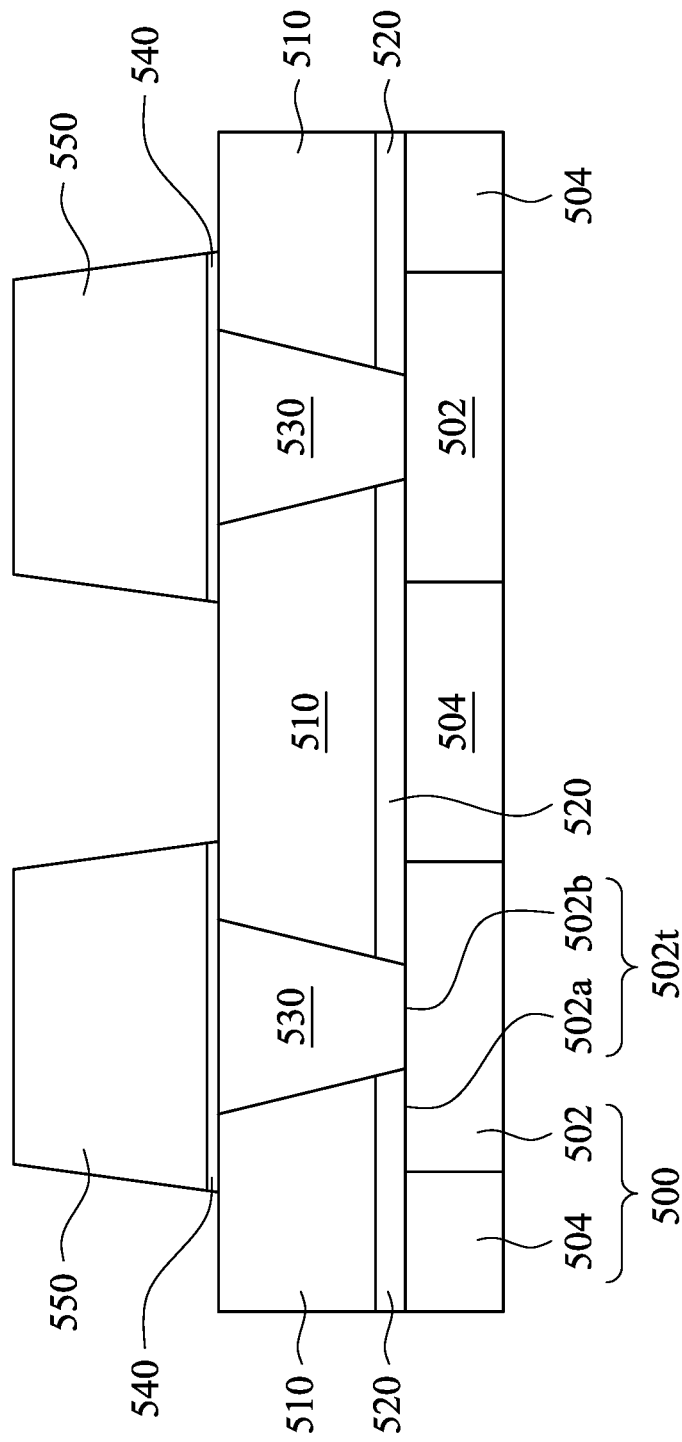

As shown in FIG. 5D, lines 550 are formed on portions of the barrier layer 540, which are located on the vias 530 and portions of the dielectric layer 510. In some examples, in forming the lines 550, as shown in FIG. 5C, a line material layer 552 is formed to cover the barrier layer 540. For example, the line material layer 552 may be formed by using an atomic layer deposition process, a chemical vapor deposition process, a physical vapor deposition process, an electroless deposition process, or an electrochemical plating process. The line material layer 552 and the vias 530 are formed from different materials, and the line material layer 552 has an etch selectivity with respect to vias 530. The line material layer 552 may be formed from metal, such as Cu, Ni, Co, Ru, Ir, Al, Pt, Pd, Au, Ag, Os, W, Mn, or alloys thereof. In some exemplary examples, a process temperature in forming the line material layer 552 is substantially equal to or smaller than 425 degrees centigrade. As shown in FIG. 5D, the line material layer 552 and the barrier layer 540 are patterned by using, for example, a photolithography technique and an etch technique. Portions of the line material layer 552 and portions of the barrier layer 540, which are underlying the portions of the line material layer 552, are removed, so as to form the lines 550 on the other portions of the barrier layer 540, which are located on the vias 530 and the portions of the dielectric layer 510.

The vias 530 have an etch selectivity with respect to the line material layer 552, such that it may prevent the vias 530 from being damaged during the patterning process of the line material layer 552.

Figure 5E:
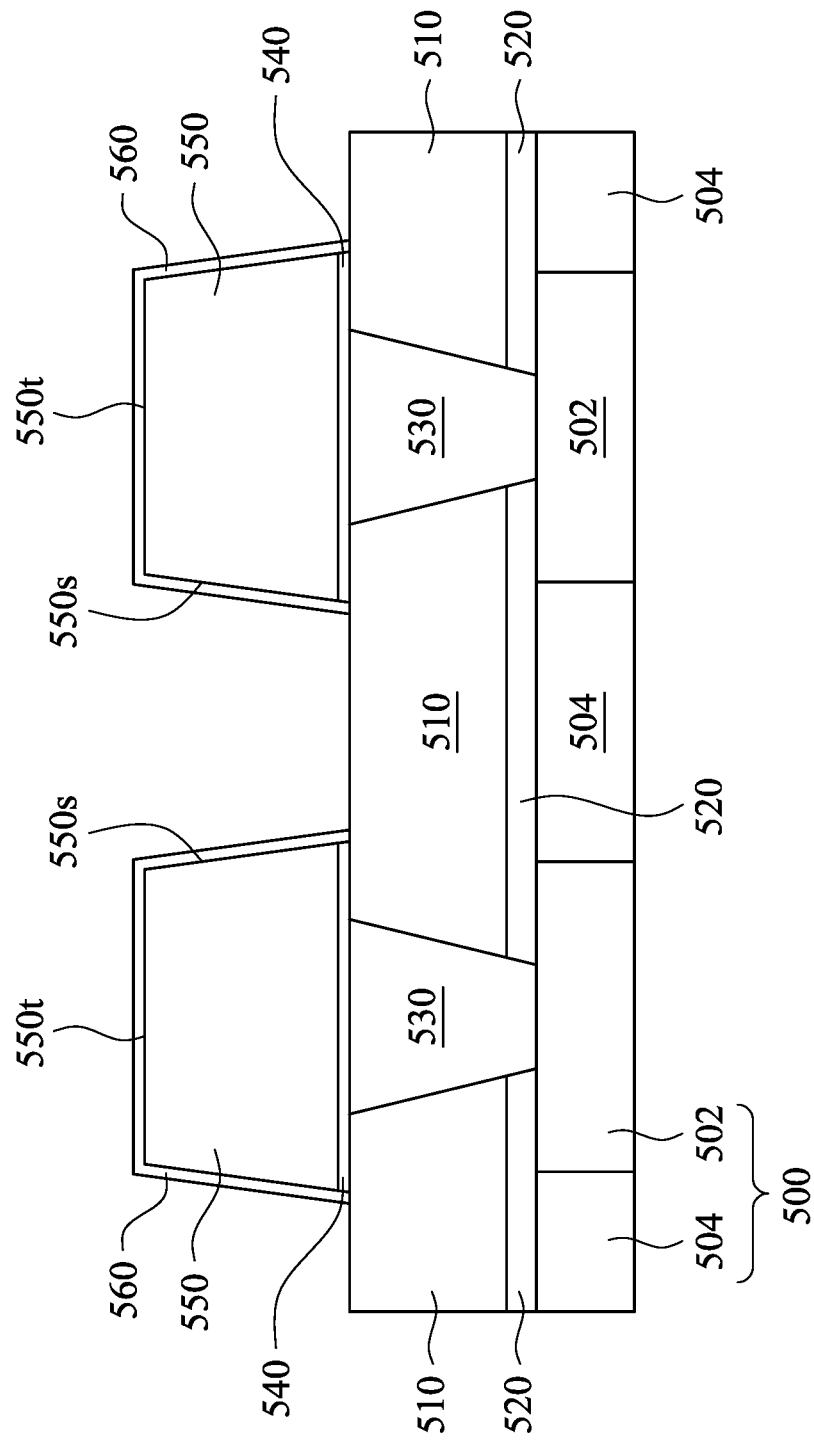

As shown in FIG. 5E, capping layers 560 are respectively formed on top surfaces 550t of the lines 550 to peripherally enclose side surfaces 550s of the lines 550. The capping layers 560 have an etch selectivity with respect to the lines 550. The capping layers 560 may be formed from a conductive material. In some exemplary examples, the capping layers 560 are formed from graphene. For example, the capping layers 560 may be formed by using an atomic layer deposition process, a chemical vapor deposition process, a plasma-enhanced atomic layer deposition process, or a plasma-enhanced chemical vapor deposition process. A process temperature of forming the capping layers 560 may be in a range substantially from 25 degrees centigrade to 1000 degrees centigrade. For example, the process temperature of forming the capping layers 560 may be in a range substantially from 25 degrees centigrade to 425 degrees centigrade. Each of the capping layers 560 may be formed to have a thickness substantially ranging from 3 angstroms to 30 angstroms.

In some exemplary examples, the capping layers 560 include graphene layers, and are formed by using a chemical vapor deposition process or a plasma-enhanced chemical vapor deposition process. The graphene layers are grown under the catalyst of the lines 550. In the chemical vapor deposition process or a plasma-enhanced chemical vapor deposition process, reactants may include $C_xH_y$ and $H_2$, a flow of the reactants may be in a range substantially from 100 sccm to 10000 sccm, a process pressure is in a range substantially from 0.1 torr to 760 torr, and a process temperature may be in a range substantially from 25 degrees centigrade to 425 degrees centigrade. In the plasma-enhanced chemical vapor deposition process, a plasma power may be in a range substantially from 50 W to 1000 W.

Figure 5F:
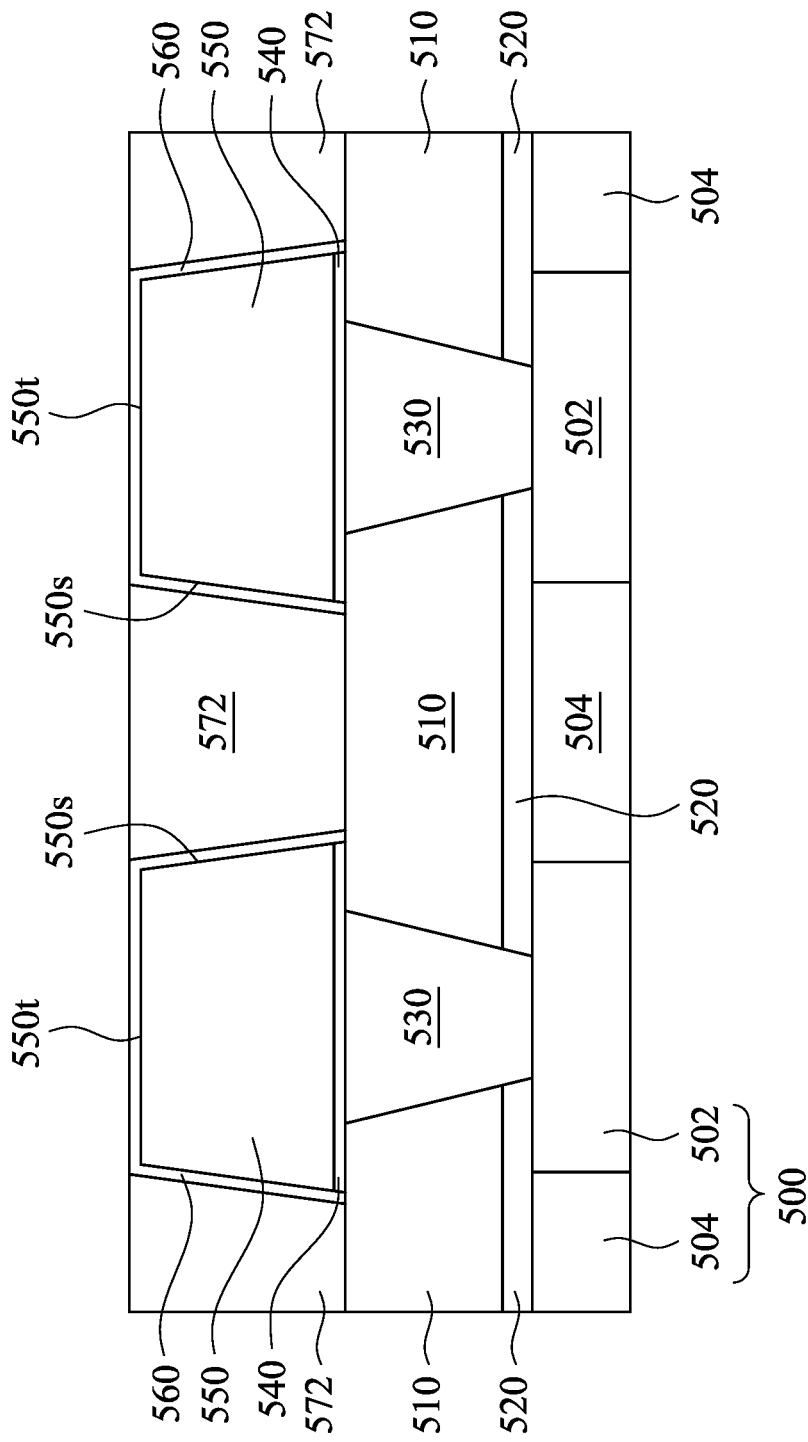
Figure 5G:
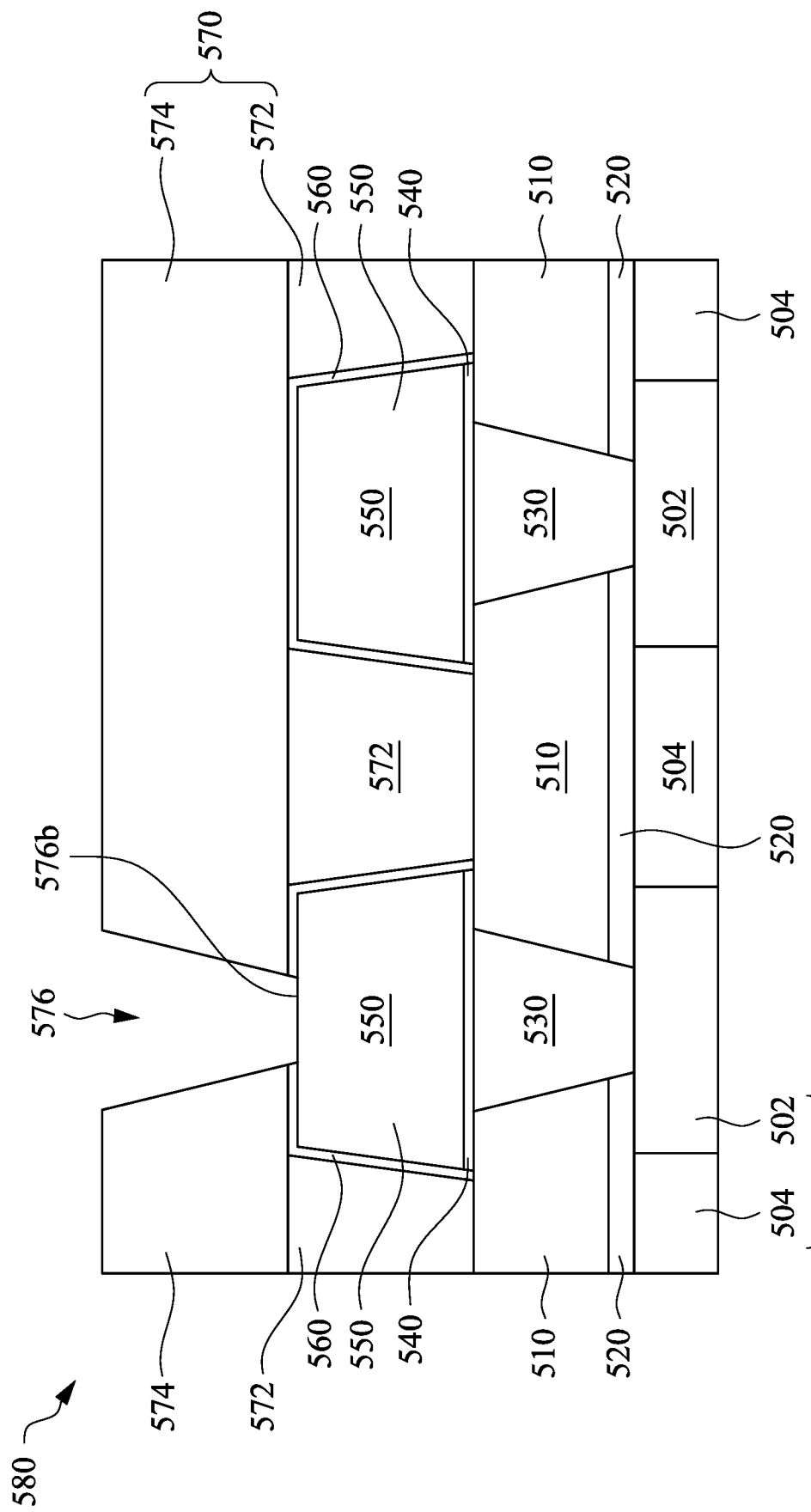

As shown in FIG. 5G, a dielectric layer 570 is formed on of the dielectric layer 510 and the capping layers 560 to peripherally enclose the lines 550 to form a semiconductor device 580. For example, the dielectric layer 570 may be formed by using, a chemical vapor deposition process or a plasma-enhanced chemical vapor deposition process. In some exemplary examples, a process temperature in forming the dielectric layer 570 is substantially equal to or smaller than 425 degrees centigrade. A dielectric constant value of the dielectric layer 570 may be in a range substantially from 1.0 to 3.8. For example, the dielectric layer 570 may be formed from $SiO_x$, $SiO_xC_yH_z$, $SiO_xC_y$, $SiC_x$, $SiN_z$, or a low-K material. The dielectric layer 570 may be a single-layered structure. At least one via hole 576 is formed in the dielectric layer 570 over the line 550 by using, for example, a photolithography technique and an etch technique. The via hole 576 is formed to extend from the dielectric layer 570 to the capping layer 560 or to the line 550, that is the via hole 576 is formed to have a bottom 576b which exposes the capping layer 560 or the line 550.

In some exemplary examples, the dielectric layer 570 is formed to include at least two dielectric layers, such as a first dielectric layer 572 and a second dielectric layer 574. As shown in FIG. 5F, in forming the dielectric layer 570, the first dielectric layer 572 is formed on the dielectric layer 510 to peripherally enclose the lines 550. Portions of the capping layers 560, which are located on top surfaces 550t of the lines 550, may not be covered by the first dielectric layer 572. As shown in FIG. 5G, the second dielectric layer 574 is formed on the first dielectric layer 572 and the capping layers 560. The via hole 576 is formed in the second dielectric layer 574 over the line 550.

The capping layers 560 have an etch selectivity with respect to the lines 550, such that additional liner layers and barrier layers are omitted, thereby enhancing the RC performance of the semiconductor device 580 and reducing the fabrication cost. Moreover, the capping layers 560 is used as etching stop layers during the patterning process of the via hole 576, such that an additional etching stop layer is omitted, thereby preventing the capacitance impact and reducing the fabrication cost.

Figure 6:
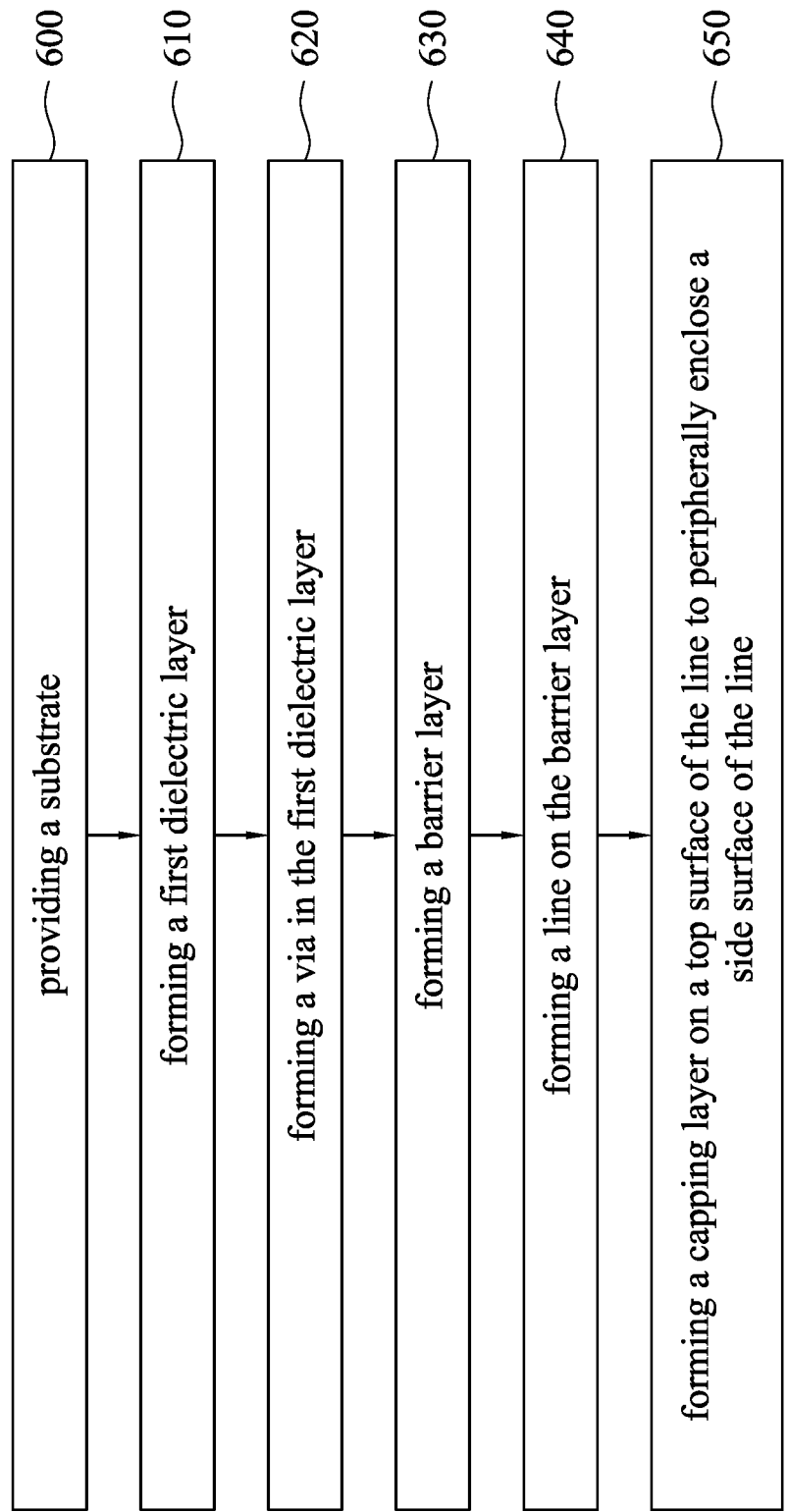
FIG. 6 is a flow chart of a method for manufacturing a semiconductor device in accordance with various embodiments.

Referring to FIG. 6 with FIG. 5A through FIG. 5G, FIG. 6 is a flow chart of a method for manufacturing a semiconductor device in accordance with various embodiments. The method begins at operation 600, where a substrate 500 is provided. In some exemplary examples, the substrate 500 is provided to include at least one conductive layer 502 and at least one dielectric layer 504, in which the conductive layer 502 is formed in the dielectric layer 504, and a top surface 502t of the conductive layer 502 is not covered by the dielectric layer 504. The top surface 502t of the conductive layer 502 is formed to have a first portion 502a and a second portion 502b.

At operation 610, referring to FIG. 5A again, a dielectric layer 510 is formed on portions of the substrate 500 by using, for example, a chemical vapor deposition process or a plasma-enhanced chemical vapor deposition process. Optionally, before forming the dielectric layer 510, an etching stop layer 520 may be formed to cover the substrate 500. The etching stop layer 520 has an etch selectivity with respect to the dielectric layer 510.

At operation 620, as shown in FIG. 5B, one or more vias 530 are formed in the dielectric layer 510 on the second portion 502b of the top surface 502t of the conductive layers 502 respectively. In some examples, in forming the vias 530, via holes 512 are formed in the dielectric layer 510 and the etching stop layer 520. As shown in FIG. 5A, the via holes 512 correspond to the conductive layers 502 respectively, and each of the via holes 512 extends from the dielectric layer 510 to the top surface 502t of the conductive layer 502 and exposes the second portion 502b of the top surface 502t of the conductive layer 502. As shown in FIG. 5B, the via holes 512 are respectively filled with the vias 530. For example, the vias 530 may be formed by using an atomic layer deposition process, a chemical vapor deposition process, or an electroless deposition process.

At operation 630, as shown in FIG. 5C, a barrier layer 540 may be optionally formed to cover the dielectric layer 510 and the vias 530. In some exemplary examples, the barrier layer 540 is formed by using a chemical vapor deposition process or a plasma-enhanced chemical vapor deposition process.

At operation 640, as shown in FIG. 5D, lines 550 are formed on portions of the barrier layer 540, which are located on the vias 530 and portions of the dielectric layer 510. In some examples, in forming the lines 550, as shown in FIG. 5C, a line material layer 552 is formed to cover the barrier layer 540 by using, for example, an atomic layer deposition process, a chemical vapor deposition process, a physical vapor deposition process, an electroless deposition process, or an electrochemical plating process. The line material layer 552 and the vias 530 are formed from different materials, and the line material layer 552 has an etch selectivity with respect to vias 530. As shown in FIG. 5D, the line material layer 552 and the barrier layer 540 are patterned by using, for example, a photolithography technique and an etch technique. Portions of the line material layer 552 and underlying portions of the barrier layer 540 are removed, so as to form the lines 550 on the other portions of the barrier layer 540, which are located on the vias 530 and the portions of the dielectric layer 510.

At operation 650, as shown in FIG. 5E, capping layers 560 are respectively formed on top surfaces 550t of the lines 550 to peripherally enclose side surfaces 550s of the lines 550. The capping layers 560 have an etch selectivity with respect to the lines 550. In some exemplary examples, the capping layers 560 are formed from graphene. For example, the capping layers 560 may be formed by using an atomic layer deposition process, a chemical vapor deposition process, a plasma-enhanced atomic layer deposition process, or a plasma-enhanced chemical vapor deposition process.

As shown in FIG. 5G, a dielectric layer 570 is formed on of the dielectric layer 510 and the capping layers 560 to peripherally enclose the lines 550 to form a semiconductor device 580. For example, the dielectric layer 570 may be formed by using, a chemical vapor deposition process. The dielectric layer 570 may be a single-layered structure. At least one via hole 576 is formed in the dielectric layer 570 over the line 550 by using, for example, a photolithography technique and an etch technique. The via hole 576 is formed to have a bottom 576b which exposes the capping layer 560 or the line 550.

In some exemplary examples, the dielectric layer 570 is formed to include at least two dielectric layers, such as a first dielectric layer 572 and a second dielectric layer 574. As shown in FIG. 5F, in forming the dielectric layer 570, the first dielectric layer 572 is formed on the dielectric layer 510 to peripherally enclose the lines 550. As shown in FIG. 5G, the second dielectric layer 574 is formed on the first dielectric layer 572 and the capping layers 560. The via hole 576 is formed in the second dielectric layer 574 over the line 550.

In some embodiments, a method for manufacturing a semiconductor structure includes: forming a dielectric layer over a conductive layer on a semiconductor substrate; etching the dielectric layer to form a via hole that exposes the conductive layer; depositing a barrier layer to line the via hole; after depositing the barrier layer, depositing a first metal layer to fill a remainder of the via hole; performing a chemical mechanical polishing (CMP) process on the first metal layer until the barrier layer is exposed; after performing the CMP process, depositing a second metal layer over the barrier layer and the first metal layer; and etching the second metal layer to form a metal line.

In some embodiments, a method for manufacturing a semiconductor structure includes: depositing a first dielectric over a semiconductor substrate; forming a metal via extending through the first dielectric; depositing a metal layer over the first dielectric and the metal via; patterning the metal layer to form a metal line; forming a graphene layer to wrap around the metal line; after forming the graphene layer, depositing a second dielectric layer over the metal line; and performing a chemical mechanical polishing (CMP) process on the second dielectric layer, wherein the CMP process stops at the graphene layer.

In some embodiments, a semiconductor structure includes a semiconductor substrate, a dielectric layer, a via, a first graphene layer, and a metal line. The dielectric layer is over the semiconductor substrate. The via extends through the dielectric layer. The first graphene layer extends along a top surface of the via. The metal line spans the first graphene layer. The metal line has a line width decreasing as a distance from the first graphene layer increases. In some embodiments, a top surface of the first graphene layer is higher than a top surface of the dielectric layer. In some embodiments, the first graphene layer has a maximal width greater than a maximal width of the via. In some embodiments, the via has a width decreasing as a distance from the first graphene layer increases. In some embodiments, the semiconductor structure further includes a second graphene layer wrapping the metal line. In some embodiments, the second graphene layer has a bottom end in contact with a top surface of the first dielectric layer. In some embodiments, the semiconductor structure further includes a second dielectric layer laterally surrounding the metal line, the second graphene layer having a top surface level with a top surface of the second dielectric layer. In some embodiments, the semiconductor structure further includes a barrier layer that has a lower lateral portion extending along a bottom surface of the via, an inclined portion along a sidewall of the via and inclined with respect to the bottom surface of the via, and an upper lateral portion extending from a top end of the inclined portion along a top surface of the first dielectric layer, wherein the metal line is in contact with the upper lateral portion of the barrier layer. In some embodiments, the upper lateral portion of the barrier layer encloses the first graphene layer. In some embodiments, the upper lateral portion of the barrier layer has an end surface coterminous with a sidewall of the metal line.

In some embodiments, a semiconductor structure includes a semiconductor substrate, a metal via, a barrier layer, a metal line, and a graphene layer. The metal via is above the semiconductor substrate. The barrier layer extends across the metal via. The metal line is over the metal via. The graphene layer wraps the metal line, the graphene layer having opposite inner sidewalls respectively is in contact with opposite sides of the barrier layer. In some embodiments, the graphene layer encloses the barrier layer. In some embodiments, the barrier layer is sandwiched between the metal via and the metal line. In some embodiments, the barrier layer has an end surface coterminous with a sidewall of the metal line. In some embodiments, the barrier layer has a width greater than a maximal width of the via.

In some embodiments, a semiconductor structure includes a semiconductor substrate, a metal via, a metal line, a first graphene layer, and a second graphene layer. The metal line is over the metal via. The first graphene layer is sandwiched between the metal via and the metal line. The second graphene layer wraps the metal line. From a cross-sectional view, the second graphene layer on a top surface of the metal line has a greater lateral dimension than the first graphene layer on the metal via. In some embodiments, the second graphene layer encloses the first graphene layer. In some embodiments, the second graphene layer is spaced apart from the first graphene layer. In some embodiments, the second graphene layer has a bottom end in a lower position than a top surface of the first graphene layer. In some embodiments, the second graphene layer is spaced apart from the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate;
a metal via above the semiconductor substrate;
a metal line over the metal via;
a first graphene layer sandwiched between the metal via and the metal line; and
a second graphene layer wrapping the metal line, wherein from a cross-sectional view, the second graphene layer on a top surface of the metal line has a greater lateral dimension than the first graphene layer on the metal via.

2. The semiconductor structure of claim 1, wherein the second graphene layer encloses the first graphene layer.

3. The semiconductor structure of claim 1, wherein the second graphene layer has a bottom end in a lower position than a top surface of the first graphene layer.

4. The semiconductor structure of claim 1, wherein the second graphene layer is spaced apart from the first graphene layer.

5. The semiconductor structure of claim 1, wherein the second graphene layer is spaced apart from the metal via.

6. A semiconductor structure, comprising:
a semiconductor substrate;
a metal via above the semiconductor substrate;
a barrier layer extending across the metal via;
a metal line over the metal via; and
a first graphene layer wrapping the metal line, the first graphene layer having opposite inner sidewalls respectively in contact with opposite sides of the barrier layer.

7. The semiconductor structure of claim 6, wherein the first graphene layer encloses the barrier layer.

8. The semiconductor structure of claim 6, wherein the barrier layer has an end surface coterminous with a sidewall of the metal line.

9. The semiconductor structure of claim 6, wherein the barrier layer has a width greater than a maximal width of the metal via.

10. The semiconductor structure of claim 6, further comprising:
a second graphene layer disposed on a top surface of the metal via, wherein the barrier layer extends across the metal via and the second graphene layer.

11. A semiconductor structure, comprising:
a semiconductor substrate;
a first dielectric layer over the semiconductor substrate;
a via extending through the first dielectric layer;
a first graphene layer extending along a top surface of the via; and
a metal line spanning the first graphene layer, wherein the metal line has a line width decreasing as a distance from the first graphene layer increases.

12. The semiconductor structure of claim 11, wherein a top surface of the first graphene layer is higher than a top surface of the first dielectric layer.

13. The semiconductor structure of claim 11, wherein the first graphene layer has a maximal width greater than a maximal width of the via.

14. The semiconductor structure of claim 11, wherein the via has a width decreasing as a distance from the first graphene layer increases.

15. The semiconductor structure of claim 11, further comprising a second graphene layer wrapping the metal line.

16. The semiconductor structure of claim 15, wherein the second graphene layer has a bottom end in contact with a top surface of the first dielectric layer.

17. The semiconductor structure of claim 15, further comprising a second dielectric layer laterally surrounding the metal line, the second graphene layer having a top surface level with a top surface of the second dielectric layer.

18. The semiconductor structure of claim 11, further comprising a barrier layer that has a lower lateral portion extending along a bottom surface of the via, an inclined portion along a sidewall of the via and inclined with respect to the bottom surface of the via, and an upper lateral portion extending from a top end of the inclined portion along a top surface of the first dielectric layer, wherein the metal line is in contact with the upper lateral portion of the barrier layer.

19. The semiconductor structure of claim 18, wherein the upper lateral portion of the barrier layer encloses the first graphene layer.

20. The semiconductor structure of claim 18, wherein the upper lateral portion of the barrier layer has an end surface coterminous with a sidewall of the metal line.

* * * * *